(12) United States Patent
Tsuchi

(10) Patent No.: US 6,897,726 B2
(45) Date of Patent: May 24, 2005

(54) DIFFERENTIAL CIRCUIT, AMPLIFIER CIRCUIT, AND DISPLAY DEVICE USING THE AMPLIFIER CIRCUIT

(75) Inventor: Hiroshi Tsuchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/464,517

(22) Filed: Jun. 19, 2003

(65) Prior Publication Data

US 2004/0000949 A1 Jan. 1, 2004

(30) Foreign Application Priority Data

Jun. 28, 2002 (JP) ........................................ 2002-189457

(51) Int. Cl.$^7$ ................................................. H03F 3/45
(52) U.S. Cl. ..................................... 330/253; 330/257
(58) Field of Search ................................. 330/253, 257

(56) References Cited

U.S. PATENT DOCUMENTS

| | | | |
|---|---|---|---|
| 4,555,673 A | | 11/1985 | Huijsing et al. |
| 5,179,354 A | * | 1/1993 | Okamoto ..................... 330/253 |
| 5,714,906 A | | 2/1998 | Motamed et al. |
| 5,729,177 A | | 3/1998 | Goutti |
| 6,100,762 A | * | 8/2000 | Kato ........................... 330/255 |
| 6,480,178 B1 | * | 11/2002 | Itakura et al. ................ 345/89 |
| 6,567,327 B2 | * | 5/2003 | Tsuchi ......................... 365/203 |

FOREIGN PATENT DOCUMENTS

| | | |
|---|---|---|
| JP | 5-63464 A | 3/1993 |
| JP | 7-31351 A | 2/1995 |
| JP | 9-93055 A | 4/1997 |
| JP | 2000-252768 A | 9/2000 |
| JP | 2002-258821 A | 9/2002 |

\* cited by examiner

*Primary Examiner*—Patricia Nguyen
(74) *Attorney, Agent, or Firm*—Sughrue Mion, PLLC

(57) ABSTRACT

A differential circuit comprises first and second differential pairs driven by constant-current sources, respectively, for receiving input voltages, first transistors, second transistors, and switches are included. In a first connection state, one current mirror comprises among the first transistors. Input and output terminals of the one current mirror are connected to outputs of the first differential pair. Two current mirrors are composed by the second transistors. Inputs of the two current mirrors are connected to the outputs of the second differential pair, and the outputs of the two current mirrors are connected to an input and an output of the one current mirror circuit. The output of the one current mirror is a first output. In a second connection state, one current mirror comprises among the second transistors. The input and the output of the one current mirror are connected to the outputs of the second differential pair. Two current mirrors are composed by the first transistors. The inputs of the two current mirrors are connected to the outputs of the first differential pair, and the outputs of the two current mirror circuits are connected to the input and the output of the one current mirror circuit, respectively. The output terminal of the one current mirror is a second output terminal.

23 Claims, 18 Drawing Sheets

FIG. 2

|  | FIRST CONNECTION CHANGEOVER | SECOND CONNECTION CHANGEOVER |
|---|---|---|
| SWITCHES 511, 512, 513, 514 | OFF | ON |
| SWITCHES 521, 522, 523, 524 | ON | OFF |
| FIRST DIFFERENTIAL OUTPUT Vdf1 | ACTIVE | INACTIVE |
| SECOND DIFFENRENTIAL OUTPUT Vdf2 | INACTIVE | ACTIVE |

EQUIVALENT CIRCUIT IN FIRST CONNECTION CHANGEOVER

EQUIVALENT CIRCUIT IN SECOND CONNECTION CHANGEOVER

FIG. 5

|  | FIRST CONNECTION CHANGEOVER | SECOND CONNECTION CHANGEOVER |
|---|---|---|
| SWITCHES 531, 532, 533, 534 | OFF | ON |
| SWITCHES 541, 542, 543, 544 | ON | OFF |
| FIRST CONNECTION CHANGEOVER | ACTIVE | INACTIVE |
| SECOND CONNECTION CHANGEOVER | INACTIVE | ACTIVE |

FIG. 7

|  | FIRST CONNECTION CHANGEOVER | SECOND CONNECTION CHANGEOVER |
|---|---|---|
| SWITCHES 511, 512, 513, 514 | OFF | ON |
| SWITCHES 521, 522, 523, 524 | ON | OFF |
| AMPLIFICATION STAGE 310 | OPERATE | STOP |
| AMPLIFICATION STAGE 320 | STOP | OPERATE |

FIG. 9

| | CHARGING OPERATION (FIRST CONNECTION CHANGEOVER) | CHARGING OPERATION (SECOND CONNECTION CHANGEOVER) |
|---|---|---|
| SWITCHES 511, 512, 513, 514 561, 563, 552 | OFF | ON |
| SWITCHES 521, 522, 523, 524 551, 553, 562 | ON | OFF |

FIG. 11

| | CHARGING OPERATION (FIRST CONNECTION CHANGEOVER) | DISCHARGING OPERATION (SECOND CONNECTION CHANGEOVER) |
|---|---|---|
| SWITCHES 511, 512, 513, 514 561, 552, 581, 582, 583 | OFF | ON |
| SWITCHES 521, 522, 523, 524 551, 562, 571, 572, 573 | ON | OFF |

FIG . 13

|  | CHARGING OPERATION (FIRST CONNECTION CHANGEOVER) | DISCHARGING OPERATION (SECOND CONNECTION CHANGEOVER) |
|---|---|---|
| SWITCHES 511, 512, 513, 514 561, 552, 583 | OFF | ON |
| SWITCHES 521, 522, 523, 524 551, 562, 573 | ON | OFF |

DIFFERENTIAL CIRCUIT, AMPLIFIER CIRCUIT, AND DISPLAY DEVICE USING THE AMPLIFIER CIRCUIT

FIELD OF THE INVENTION

The present invention relates to a differential circuit, an amplifier circuit, and a display device including the amplifier circuit.

BACKGROUND OF THE INVENTION

As an operational amplifier that enables wide input and output ranges, the operational amplifier with the wide input and output ranges as shown in FIG. 17 is disclosed in JP Patent Kokai Publication JP-A-5-63464. The operational amplifier in FIG. 17 is comprised of a differential circuit 910 and an output stage 950. In the differential circuit 910, a current mirror circuit composed by PMOS transistors (912, 913) (referred to as a "PMOS current mirror circuit") is connected as a load circuit to outputs of a differential pair of NMOS transistors (915, 916) (also referred to an "NMOS differential pair), driven by a current source 917. Further, input terminals of two pairs of current mirror circuits composed by NMOS transistors (referred to as "NMOS current mirror circuits") are respectively connected to outputs of a differential pair of PMOS transistors (925, 926) (also referred to as a "PMOS differential pair"), driven by a current source 927. That is, an input terminal of a first NMOS current mirror circuit (921, 922) (a drain of the transistor 922) is connected to the drain of the PMOS transistor 925 constituting the output terminal of the PMOS differential pair (925, 926), and the input terminal of a second NMOS current mirror circuit (923, 924) (the drain of the transistor 923) is connected to the drain of the PMOS transistor 926 constituting the output terminal of the PMOS differential pair (925, 926).

The drain of the transistor 921, which constitutes an output terminal of the first NMOS current mirror circuit (921, 922) is connected to a connecting point between the drain of the transistor 915 constituting the output terminal of the NMOS differential pair (915, 916) and the drain of the transistor 912 constituting the output terminal of the PMOS current mirror circuit (912, 913). The drain of the transistor 924 constituting the output terminal of the second NMOS current mirror circuit (923, 924) is connected to a connecting point between the drain of the transistor 916 constituting the output terminal of the NMOS differential pair (915, 916) and the drain of the transistor 913 constituting the input terminal of the PMOS current mirror circuit (912, 913).

A gate of the transistor 915 of the NMOS differential pair and the gate of the transistor 926 of the PMOS differential pair are connected to a common connecting point, to which an input terminal voltage Vin is supplied.

The gate of the transistor 916 of the NMOS differential pair and the gate of the transistor 925 of the PMOS differential pair are connected to a common connecting point, to which an output terminal voltage Vout is supplied.

A common connecting node among the drains of the transistors 912, 915, and 921 is an output Vdf of the differential circuit 910.

The output stage 950 comprises a PMOS transistor 951 of which the drain is connected to an output terminal, a source is connected to a high-potential power supply terminal VDD, and the gate receives the output Vdf of the differential circuit 910, a constant-current source 952 connected between the output terminal and a low-potential source terminal VSS, and a phase compensating capacitor 953 connected between the gate of the PMOS transistor 951 and the output terminal.

The operational amplifier in FIG. 17 is a voltage follower circuit where a voltage equal to the input voltage Vin received at an input terminal 1 is outputted to an output terminal 2 as the output voltage Vout.

Next, an operation of the differential circuit 910 will be described. For simplicity of a description, a pair of transistors that constitute a differential pair or a current mirror circuit is assumed to have mutually identical transistor characteristics. Further, a description will be given, with a state where two differential input voltages Vin and Vout are equal defined as a reference state.

In the reference state where the Vin equals to the Vout, currents that flow through the pair of transistors of the PMOS differential pair (925, 926) are equal to each other, and each of the current is half a current of the constant-current source 927. The currents of the transistors 925 and 926 flow through the transistors 921 and 924, respectively, as mirror currents in the same magnitude due to the current mirror circuit (921, 922) and the current mirror circuit (923, 924). The currents that flow through the pair of transistors of the NMOS differential pair (915, 916) are also equal to each other, and each of the currents is half the current of the constant-current source 917. On the other hand, the currents that flow through the pair of the transistors of the current mirror circuit (912, 913) are also equal to each other. A sum of half the current of the constant-current source 917 and half the current of the constant-current source 927 flows through each of the transistors 912 and 913.

Since currents flowing through the pair of transistors of the differential pair are equal and currents flowing through the pair of the transistors of the current mirror circuit are equal in this manner, voltages at the terminals of the pair of transistors are also equal to each other. The output Vdf of the differential circuit (the output of the drain of the transistor 912) becomes stable around the drain voltage or the gate voltage of the transistor 913.

When the magnitude relation of the differential input voltages Vin and Vout becomes Vin>Vout, at the differential pair (915, 916), a gate-source voltage of the transistor 915 increases, and the gate-source voltage of the transistor 916 decreases, which functions to cause much current to flow through the transistor 915. For this reason, a discharging operation of the transistor 915 becomes strong, which functions to reduce the output Vdf of the differential circuit.

On the other hand, at the differential pair (925, 926), the gate-source voltage of the transistor 925 increases, and the gate-source voltage of the transistor 926 decreases, which functions to cause much current to flow through the transistor 925. Thus, the current of the transistor 921 through which its mirror current flows also increases. Accordingly, the discharging operation of the transistor 921 becomes strong, which also functions to reduce the output Vdf of the differential circuit.

When the magnitude relation of the differential input voltage Vin and Vout becomes Vin<Vout, at the differential pair (915, 916), the gate-source voltage of the transistor 916 increases, and the gate-source voltage of the transistor 915 decreases. Thus, the discharging operation of the transistor 915 becomes weak, which functions to increase the differential circuit output Vdf. On the other hand, at the differential pair (925, 926), the gate-source voltage of the transistor 926 increases, and the gate-source voltage of the transistor 925 decreases, which functions to limit the current of the transistor 925. The current of the transistor 921 through which its mirror current flows also decreases. For this reason, the discharging operation of the transistor 921 becomes weak, which also functions to increase the differential circuit output Vdf.

In this manner, in the differential circuit 910, when the Vin becomes larger than the Vout, the differential circuit output voltage Vdf is reduced. When the Vin becomes smaller than the Vout, the differential circuit output voltage Vdf increases. Accordingly, in the amplifier circuit in FIG. 17, when the Vin is larger than the Vout, the gate voltage of the PMOS transistor 951 in the output stage 950 is reduced, so that the output terminal 2 is charged at high speed. When the Vin is smaller than the Vout, the gate voltage of the PMOS transistor 951 is increased to be turned off. Then, the output terminal 2 is discharged through the constant-current source 952, and then becomes stable at a point where a drain current of the PMOS transistor 951 balances the current controlled by the constant-current source 952 and the Vin equals to the Vout.

A characteristic of the operational amplifier resides in the differential circuit 910. In the differential circuit 910, when the input voltage Vin is in a wide medium voltage range of a power supply voltage range (from a power supply VSS to a power supply VDD), the NMOS differential pair (915, 916) and the PMOS differential pair (925, 926) both operate, and through the differential circuit output Vdf, the gate of the transistor 951 in the output stage 950 is controlled, thereby allowing the operational amplifier to operate. Further, even if the input voltage Vin is around the power supply voltage and one of the differential pairs stops operation, the differential circuit output Vdf is normally output by the operation of the other differential pair. The operational amplifier can be thereby operated normally.

Assume that the input voltage Vin is around a low-potential power supply voltage VSS and becomes lower than a threshold voltage Vtn for the NMOS transistors 915 and 916. Then, the NMOS differential pair (915, 916) stops operation (to be in an off-state). However, the PMOS differential pair (925, 926), the NMOS current mirror circuits (921, 922 and 923, 924), and the PMOS current mirror circuit (912, 913) operate. Thus, through the differential circuit output Vdf, the output stage 950 can be operated normally.

On the other hand, when the input voltage Vin is around a high-potential power supply voltage VDD and the gate-source voltages of the PMOS transistors 925 and 926 become smaller than the absolute value for their threshold voltage Vtp, the PMOS differential pair (925, 926) stops operation (to be in the off-state). The NMOS current mirror circuits (921, 922 and 923, 924) also stop operation. The NMOS differential pair (915, 916) and the PMOS current mirror circuit (912, 913), however, operate. Thus, through the differential unit output Vdf, the output stage 950 can be operated normally. Accordingly, the operational amplifier in FIG. 17 can operate in a wide input and output range substantially equal to the power supply voltage range.

When the operational amplifier in FIG. 17 is employed in a driver circuit for a comparatively large capacitive load such as a liquid crystal display device, the charging operation on the output terminal 2 through the output stage 950 can be performed at high speed by the transistor 951. However, the discharging operation on the output terminal 2 is performed by the constant-current source 952. Thus, if the current of the constant-current source 952 is decreased, a discharging operation becomes slow and a driving speed becomes insufficient. If the current of the constant-current source 952 is increased, the discharging operation is performed at high speed. However, power consumption increases.

On contrast therewith, as operational amplifiers that enable the wide input and output ranges and achieve high-speed driving for both the charging and discharging operations on the output terminal, operational amplifiers in various publications (including JP Patent Kokai Publication JP-A-7-31351, JP Patent Kokai Publication JP-A-9-93055, and JP Patent Kokai Publication JP-P2000-252768) are known. FIG. 18 is a diagram showing a configuration of the operational amplifier listed as a typical example in JP Patent Kokai Publication JP-P2000-252768 (refer to FIG. 10 in this publication). Like the operational amplifier in FIG. 17, the operational amplifier in FIG. 18 is of a voltage follower structure for outputting a voltage equal to the input voltage Vin, as the output voltage Vout.

Referring to FIG. 18, this operational amplifier comprises a differential circuit 910, a connection stage 930, and an output stage 940. The differential circuit 910 has the same configuration as the differential circuit 910 in FIG. 17. Reference numerals that are the same as those in FIG. 17 are assigned to respective components in FIG. 18.

The connection stage 930 comprises a PMOS transistor 931, a constant-current source 934, a PMOS transistor 932, a PMOS transistor 933, and a constant-current source 935. The source of the PMOS transistor 931 is connected to a high-potential power supply terminal VDD, and the gate of the PMOS transistor 931 receives the differential unit output Vdf. The constant-current source 934 is connected between the drain of the PMOS transistor 931 and a low-potential power supply terminal VSS. The source of the PMOS transistor 932 is connected to a high-potential terminal VDD and the gate and the drain of the PMOS transistor 932 are connected to connection points between the drain of the PMOS transistor 931 and the constant-current source 934. The source of the PMOS transistor 933 is connected to a high-potential power supply terminal VDD and the gate of the PMOS transistor 933 is connected to a connection point between the drain of the PMOS transistor 931 and the constant-current source 934. The constant-current source 935 is connected between the drain of the PMOS transistor 933 and a low-potential power supply terminal VSS. A connection point between the drain of the PMOS transistor 933 and the constant-current source 935, is an output node of the connection stage 930.

The output stage 940 comprises a PMOS transistor 941, a PMOS transistor 942, and a phase compensating capacitor 943. The drain of the PMOS transistor 941 is connected to the output terminal 2, the source of the PMOS transistor 941 is connected to a high-potential terminal VDD, and the gate of the PMOS transistor 941 receives the differential unit output Vdf. The drain of the PMOS transistor 942 is connected to the output terminal 2, the source of the PMOS transistor 942 is connected to a low-potential power supply terminal VSS, and the gate of the PMOS transistor 942 receives the output of the connection stage 930. The phase compensating capacitor 943 is connected between the gate of the PMOS transistor 941 and the output terminal.

An operation of the differential circuit 910 in FIG. 18 is to allow outputting of the differential unit output Vdf over a wide input range substantially equal to the power supply voltage range, as in the case in FIG. 17.

The PMOS transistor 941 and the phase compensating capacitor 943 of the output stage 940 in FIG. 18 also have the same configurations as the PMOS transistor 951 and the phase compensating capacitor 953 of the output stage 950 in FIG. 17.

The operational amplifier in FIG. 18 is characterized in that the constant-current source 952 of the output stage 950 in the operational amplifier in FIG. 17 is replaced with the NMOS transistor 942, and the connection stage 930 for controlling the gate of the NMOS transistor 942 according to a change in the differential unit output Vdf is provided. Operations of the connection stage 930 and the output stage 940 will be described below.

The PMOS transistor 931 in the connection stage 930 receives the output Vdf of the differential stage, and performs the same operation as the PMOS transistor 941 of the output stage 940.

In other words, when the input voltage Vin becomes larger than the output voltage Vout, the voltage Vdf decreases from its stable state, so that the charging operation of the PMOS transistor 941 is produced to pull up the output voltage Vout. Since the PMOS transistor 931 also increases its drain voltage at this point, the PMOS transistor 933 is turned off, and the output of the connection stage 930 is reduced through the constant-current source 935. Accordingly, when the PMOS transistor 941 operates to increase the output voltage Vout, the NMOS transistor 942 is turned off.

On the other hand, when the Vin becomes smaller than the Vout, the voltage Vdf increases from its stable state, and the PMOS transistor 941 is turned off. At this point, the PMOS transistor 931 is also turned off, and its drain voltage is reduced through the constant-current source 934. Thus, the PMOS transistor 933 increases its drain voltage, thereby increasing the output voltage of the connection stage 930 and then turning on the NMOS transistor 942. Accordingly, when the PMOS transistor 941 is turned off, the discharging operation of the NMOS transistor 942 is produced to reduce the output voltage Vout at high speed.

Since the transistors 941 and 942 of the output stage 940 in the operational amplifier in FIG. 18 charges and discharges the output terminal 2, respectively, according to the output Vdf of the differential circuit 910, the charging and discharging operations can be performed speedily for driving the capacitive load as well.

However, the connection stage 930 in the operational amplifier in FIG. 18 quickly controls the discharging operation of the NMOS transistor 942, the connection stage 930 must quickly respond to a change in the voltage Vdf.

Accordingly, currents of the constant-current sources 934 and 935 for the connection stage 930 must be large to a certain extent, thereby causing a problem that the power consumption of the operational amplifier will increase.

Specifically, when the current of the constant-current source 934 has been reduced to a very low level, for example, a change in the gate voltage of the transistor 933 from the stable state to a low level becomes slower. Thus, a change in the gate voltage of the transistor 942 from the stable state to a high level is also delayed, so that a prompt discharging operation on the output terminal 2 cannot be performed.

On the other hand, when the current of the constant-current source 935 has been reduced to a very low level, a change in the gate voltage of the transistor 942 to the low level is delayed. Thus, even if the operation of the output stage 940 has been switched from the discharging operation to the charging operation, the transistor 942 is not quickly turned off. Thus, a short circuit current (through-current) is generated between the transistors 941 and 942.

Incidentally, a configuration of the connection stage 930, which is different from the one in FIG. 18 is also proposed in JP Patent Publication JP-P2000-252768. In either case, the currents of the constant-current sources constituting the connection stage must be large to a certain extent, so that there is the problem that the power consumption of the operational amplifier increases.

SUMMARY OF THE DISCLOSURE

Accordingly, an object of the present invention is to provide a differential circuit and an amplifier circuit that enable wide input and output ranges, realize high-speed driving for both charging and discharging operations, and allow a reduction in power consumption, when driving a capacitive load.

Another object of the present invention is to provide a display device which achieves low power consumption through the use of the circuit described above for a data line driver circuit in the display device.

The problem described above is ascribable to the fact that the gate voltage of the NMOS transistor for discharging the output terminal (2) cannot be directly controlled by the output signal of the differential circuit, while the gate voltage of the PMOS transistor for charging the output terminal (2) can be directly controlled by the output signal of the differential circuit.

In the example shown in FIG. 17, the output terminal (2) is discharged through the constant-current source (952). In the example shown in FIG. 18, the gate voltage of the NMOS transistor (942) for discharging the output terminal (2) is controlled through the connection stage (930).

In conventional circuits shown in FIGS. 17 and 18, a polarity symmetric configuration is possible where polarities of the respective transistors are changed and the power supply voltages VDD and VSS are interchanged. In the polarity symmetric configuration, the gate voltage of the NMOS transistor for discharging the output terminal (2) can be directly controlled by the output signal of the differential circuit. However, the gate voltage of the PMOS transistor for charging the output terminal (2) cannot be directly controlled by the output signal of the differential circuit.

Accordingly, in the present invention, in order to solve the problems described above, changeover of a polarity symmetry of the differential circuit is made according to whether charging or discharging on the output terminal is performed, thereby allowing direct control over the gate voltages of the transistors for charging and discharging the output terminal by the output signal of the differential circuit. Incidentally, a method is feasible where two polarity symmetric differential circuits are provided separately and according to whether charging or discharging on the output terminal is performed, selection between the two polarity symmetric differential circuits is performed. The number of devices, however, increases greatly, and an area of the devices also increases. On contrast therewith, the present invention solves the problems described above by a space saving differential circuit configuration where an increase in the number of devices is small.

At least one of the above -mentioned and other objects is attained by a differential circuit according to the present invention which includes:

a first differential pair, conductivity thereof being a first type, driven by a first constant-current source, for differentially receiving first and second input voltages;

a second differential pair, conductivity thereof being a second type, driven by a second constant-current source, for differentially receiving the first and second input voltages;

a first load circuit connected to a first power supply and composed by transistors of second-type conductivity, for functioning as an active load of the first differential pair;

a second load circuit connected to a second power supply and composed by transistors of first-type conductivity, for functioning as the active load of the second differential pair;

connection means for establishing connection between the first load circuit and the second load circuit, for allowing passage of a current from at least one of the first load circuit and the second load circuit to the other of the first load circuit and the second load circuit;

a first output outputted from the first load circuit; and a second output outputted from the second load circuit;

wherein the differential circuit further comprises:

changeover means for changing over between a first connection state for activating the first output and deactivating the second output and a second connection state for activating the second output and deactivating the first output.

A differential circuit according to other aspect of the present invention, for solving at least one of the above-mentioned problems or other problems includes:

a first differential pair of first-type conductivity, driven by a first constant-current source, for differentially receiving first and second input voltages;

a second differential pair of second-type conductivity, driven by a second constant-current source, for differentially receiving the first and second input voltages;

transistors of first-type conductivity, for allowing composition of at least two current mirror circuits;

transistors of second-type conductivity, for allowing composition of at least two current mirror circuits; and changeover means for changing over between a first connection state and a second connection state;

wherein in the first connection state changed over by the changeover means, one current mirror circuit of second-type conductivity is composed from among the transistors of second-type conductivity;

input and output terminals of the one current mirror circuit of second-type conductivity are connected to outputs of the first differential pair, respectively;

the transistors of first-type conductivity compose two current mirror circuits of first-type conductivity;

input terminals of the two current mirror circuits of first-type conductivity are connected to outputs of the second differential pair, respectively;

output terminals of the two current mirror circuits of first-type conductivity are connected to the input and output terminals of the one current mirror circuit of second-type conductivity, respectively;

the output terminal of the one current mirror circuit of second-type conductivity is a first output terminal; and in the second connection state changed over by the changeover means, one current circuit of first-type conductivity is composed from among the transistors of first-type conductivity;

input and output terminals of the one current mirror circuit of first-type conductivity are connected to the outputs of the second differential pair, respectively;

the transistors of second-type conductivity compose two current mirror circuits of second-type conductivity;

input terminals of the two current mirror circuits of second-type conductivity are connected to the outputs of the first differential pair, respectively;

output terminals of the two current mirror circuits of second-type conductivity are connected to the input and output terminals of the one current mirror circuit of first-type conductivity, respectively; and the output terminal of the one current mirror circuit of first-type conductivity is a second output terminal.

At least one of the above -mentioned and other objects is attained by an amplifier circuit according to other aspect of the present invention, includes:

the differential circuit according to the present invention;

a charging amplification stage for charging an output terminal in response to one output signal from two output signals of the differential circuit; and a discharging amplification stage for discharging the output terminal in response to the other output signal from the differential circuit;

wherein the output terminal is fed back to an inverting input terminal of differential input terminals of the differential circuit.

An amplifier circuit according to other aspect of the present invention includes:

the differential circuit according to the present invention, the differential circuit differentially receiving voltages of an input terminal and an output terminal;

a charging circuit for charging the output terminal based on an output signal of the differential circuit; and a follower-type discharging circuit including:

first bias control means for controlling an output bias voltage in response to the input terminal voltage, a follower transistor connected between the output terminal and the second power supply constituting a low-potential power supply, for receiving the bias voltage outputted from the first bias control means; and the follower-type discharging circuit for discharging the output terminal by the follower operation of an active load according to the voltage difference between the input terminal voltage and the output terminal voltage;

a discharging circuit for discharging the output terminal based on an output signal of the differential circuit; and a follower-type charging circuit including:

second bias control means for controlling the output bias voltage in response to the input terminal voltage; and a follower transistor connected between the output terminal and the first power supply constituting a high-potential power supply, for receiving the bias voltage from the second bias control means;

the follower-type charging circuit for charging the output terminal by the follower operation of an active load according to the voltage difference between the input terminal voltage and the output terminal voltage.

At least one of the above -mentioned and other objects is attained by a display device according to other aspect of the present invention, has as a driver circuit for driving a data line an amplifier circuit including:

the differential circuit according to the present invention, for receiving an input terminal voltage and an output terminal voltage; and amplification stages for controlling charging and discharging of the output terminal.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a table showing connection changeover control according to the first embodiment of the present invention;

FIG. 5 is a table showing connection changeover control according to the second embodiment of the present invention;

FIG. 7 is a table showing connection changeover control according to the third embodiment of the present invention;

FIG. 9 is a table showing connection changeover control according to the fourth embodiment of the present invention;

FIG. 11 is a table showing connection changeover control according to the fifth embodiment of the present invention;

FIG. 13 is a table showing connection changeover control according to the variation of the fifth embodiment of the present invention;

PREFERRED EMBODIMENTS OF THE INVENTION

Figure 1:
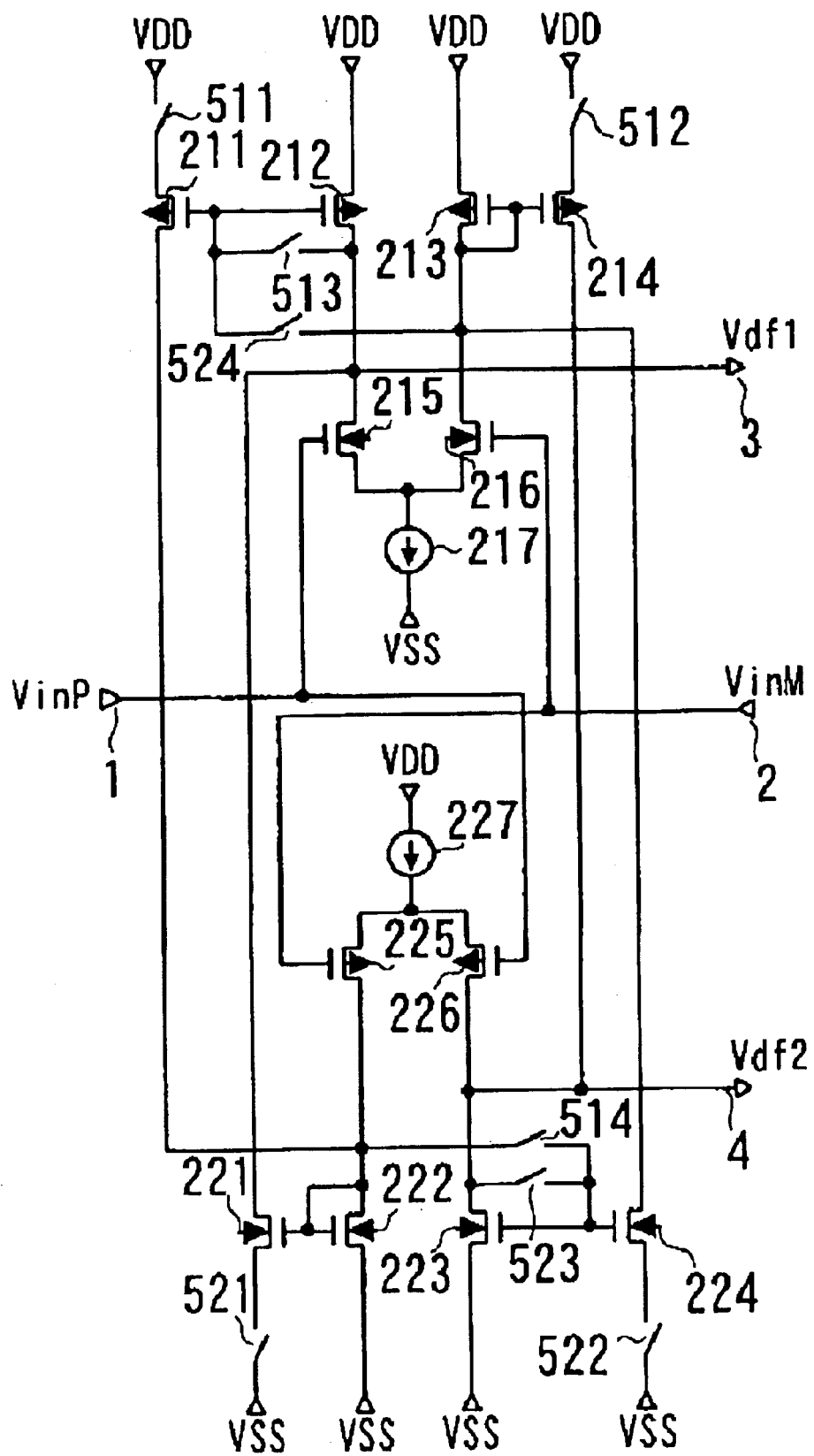
FIG. 1 is a diagram showing a configuration of a first embodiment of the present invention.

An embodiment mode of the present invention will be described. A differential circuit according to the present invention includes:

a first differential pair (215,216), conductivity thereof being a first type, driven by a first constant-current source (217), for receiving first and second input voltages (VinP and VinM) from a differential input pair thereof;

a second differential pair (225, 226), conductivity thereof being a second type, driven by a second constant-current source (227), for receiving the first and second input voltages from a differential input pair thereof;

a first load circuit, which is composed by transistors of second-type conductivity (at least two current mirror circuits comprising 211, 212, 213, and 214) connected to a first power supply (VDD), and which functions as an active load of the first differential pair;

a second load circuit, which is composed by transistors of first-type conductivity (at least two current mirror circuits comprising 221, 222, 223 and 224) connected to a second power supply, and which functions as the active load of the second differential pair;

connection means for establishing connection between the first and second load circuits, for allowing passage of a current from at least one of the first load circuit and the second load circuit to the other of the first load circuit and the second load circuit (for connection between 212 and 221, connection between 213 and 224, connection between 211 and 222, connection between 223 and 214 in FIG. 1);

a first output (Vdf1) outputted from the first load circuit;

a second output (Vdf2) outputted from the second load circuit; and changeover means for changing over between a first connection state for activating the first output (Vdf1) and deactivating the second output (Vdf2) and a second connection state for activating the second output (Vdf2) and deactivating the first output (Vdf1).

A differential circuit according to the present invention includes:

a first differential pair (215, 216), conductivity thereof being a first type, driven by a first constant-current source (217), for receiving first and second input voltages (VinP and VinM);

a second differential pair (225, 226), conductivity thereof being a second type, driven by a second constant-current source (227), for receiving the first and second input voltages (VinP and VinM);

transistors of first-type conductivity (221, 222, 223 and 224) for composing at least two current mirror circuits;

transistors of second-type conductivity (211, 212, 213 and 214) capable of composing at least two current mirror circuits; and changeover means for changing over between a first connection state and a second connection state.

In the first connection state changed over by the changeover means, one current mirror circuit of second-type conductivity is composed from among the transistors of second-type conductivity (211, 212, 213 and 214);

input and output terminals of the one current mirror circuit of second-type conductivity are connected to outputs of the first differential pair (215, 216), respectively;

two current mirror circuits of first-type conductivity are composed by the transistors of first-type conductivity (221, 222, 223, and 224);

input terminals of the two current mirror circuits of first-type conductivity are connected to outputs of the second differential pair, respectively;

output terminals of the two current mirror circuits of first-type conductivity are connected to the input and output terminals of the one current mirror circuit of second-type conductivity, respectively; and the output terminal of the one current mirror circuit of second-type conductivity is a first output terminal (3).

In the second connection state changed over by the changeover means, one current mirror circuit of first-type conductivity is composed from among the transistors of first-type conductivity (221, 222, 223 and 224);

input and output terminals of the one current mirror circuit of first-type conductivity are connected to the outputs of the second differential pair (225, 226), respectively;

two current mirror circuits of second-type conductivity are composed by the transistors of second-type conductivity (211, 212, 213 and 214);

input terminals of the two current mirror circuits of second-type conductivity are connected to the outputs of the first differential pair, respectively;

output terminals of the two current mirror circuits of second-type conductivity are connected to the input and output terminals of the one current mirror circuit; and the output terminal of the one current mirror circuit of first-type conductivity is a second output terminal (4).

Incidentally, in the first connection state, the changeover means selects two transistors from the transistors of second-type conductivity (211, 212, 213 and 214) to form one current mirror circuit of second-type conductivity. The transistors that have not been selected at this point are deactivated. Further, the output voltage (Vdf1) of the first output terminal (3) is activated, while the output voltage (Vdf2) of the second output terminal (4) is deactivated. In the second connection state, the changeover means selects two transistors from the transistors of first-type conductivity (221, 222, 223 and 224) to form one current mirror circuit of first-type conductivity. The transistors that have not been selected at this point are deactivated. Further, the output voltage (Vdf1) of the first output terminal (3) is deactivated, while the output voltage (Vdf2) of the second output terminal (4) is activated.

A bipolar transistor as well as a CMOS process can be applied to a circuit configuration described above. When applied as an amplifier circuit of a driver circuit for a liquid crystal display device, an MOS transistor may also be composed by a polysillicon thin film transistor (poly-Si TFT). Poly-Si TFTs have a high field-effect mobility, so that peripheral circuits can be integrated on a substrate.

Further, in the differential circuits of the above configurations, in a case of the MOS transistor, the outputs of the differential pair correspond to a pair of drains, white in a case of the bipolar transistor, the outputs of the differential pair correspond to a pair of collectors. In the case of the MOS transistor, the input terminal of the current mirror circuit corresponds to a drain-gate commonly connected terminal. In the case of the bipolar transistor, the input terminal corresponds to a collector-base commonly connected terminal. In the case of the MOS transistor, the output terminal of the current mirror circuit corresponds to the drain of the MOS transistor, while in the case of the bipolar transistor, the output terminal corresponds to the collector of the bipolar transistor.

Preferably, the differential circuit according to the present invention includes first and second transistors of first-type conductivity (215 and 216), third and fourth transistors of second-type conductivity (225 and 226), a fifth transistor of second-type conductivity (212), a sixth transistor of second-type conductivity (213), seventh and eighth transistors of second-type conductivity (211 and 214), a ninth transistor of first-type conductivity (222), a tenth transistor of first-type conductivity (223), eleventh and twelfth transistors of first-type conductivity (221 and 224), first and second switches (511 and 512), third and fourth switches (521 and 522), fifth and sixth switches (513 and 524), and seventh and eighth switches (514 and 523). Sources of the first and second transistors (215 and 216) are commonly connected for connection to a constant-current source (217), and the first and second transistors (215 and 216) receive input voltages VinP and VinM at their gates, respectively to form a differential pair. The sources of the third and fourth transistors (225 and 226) are commonly connected for connection to a second constant-current source (227), and the third and fourth transistors (225 and 226) receive the VinM and VinP at their gates, respectively to form the differential pair. The source of the fifth transistor (212) is connected to the first power supply (VDD), and a drain of the fifth transistor (212) is connected to the drain of the first transistor (215). The source of the sixth transistor (213) is connected to the first power supply (VDD), and the drain and the gate of the sixth transistor (213) are connected to the drain of the second transistor (216). The sources of the seventh and eighth transistors (211 and 214) are connected to the first power supply (VDD) through the first and second switches (511 and 512), respectively, and the gates of the seventh and eighth transistors (211 and 214) are connected to the gates of the fifth and sixth transistors (212 and 213). The source of the ninth transistor (222) is connected to a second power supply (VSS), and the drain and the gate of the ninth transistor (222) are connected to the drain of the third transistor (225). The source of the tenth transistor (223) is connected to the second power supply (VSS) and the drain of the tenth transistor (223) is connected to the drain of the fourth transistor (226). The sources of the eleventh and twelfth transistors (221 and 224) are connected to the second power supply (VSS) through the third and fourth switches (521 and 522), respectively, and the gates of the eleventh and the twelfth transistors (221 and 224) are connected to the gates of the ninth and tenth transistors (222 and 223). The fifth switch (513) is connected between a common gate of the fifth and seventh transistors (212and 211) and the drain of the first transistor (215). The sixth switch (524) is connected between the common gate of the fifth and seventh transistors (212 and 211) and the drain of the second transistor (216). The seventh switch (514) is connected between the common gate of the tenth and twelfth transistors (223 and 224) and the drain of the third transistor (225). The eighth switch (523) is connected between the common gate of the tenth and twelfth transistors (223 and 224) and the drain of the fourth transistor (226). The drains of the seventh and eighth transistors (211 and 214) are connected to the drains of the third and fourth transistors (225 and 226), respectively. The drains of the eleventh and twelfth transistors (221 and 224) are connected to the drains of the first and second transistors (215 and 216), respectively. A first differential output (Vdf1) is outputted from the drain (terminal 3) of the first transistor (215), and a second differential output (Vdf2) is outputted from the drain (terminal 4) of the fourth transistor (226). The differential circuit further includes control means for controlling at least one of the first differential output (Vdf1) and the second differential output (Vdf2) to be deactivated.

In the differential circuit according to the present invention, control over changeover between a first connection state and a second connection state is performed. In the first connection state, the first, second, fifth, and seventh switches (511, 512, 513, and 514) are made nonconductive, and the third, fourth, sixth, and eighth switches (521, 522, 524, and 523) are made conductive. Further, the first differential output (Vdf1) is activated, while the second differential output (Vdf2) is deactivated. In the second connection state, the first, second, fifth, and seventh switches (511, 512, 513, and 514) are made conductive, and the third, fourth, sixth, and eighth switches (521, 522, 524, and 523) are made nonconductive. The first differential output (Vdf1) is deactivated, while the second differential output (Vdf2) is activated.

Figure 4:
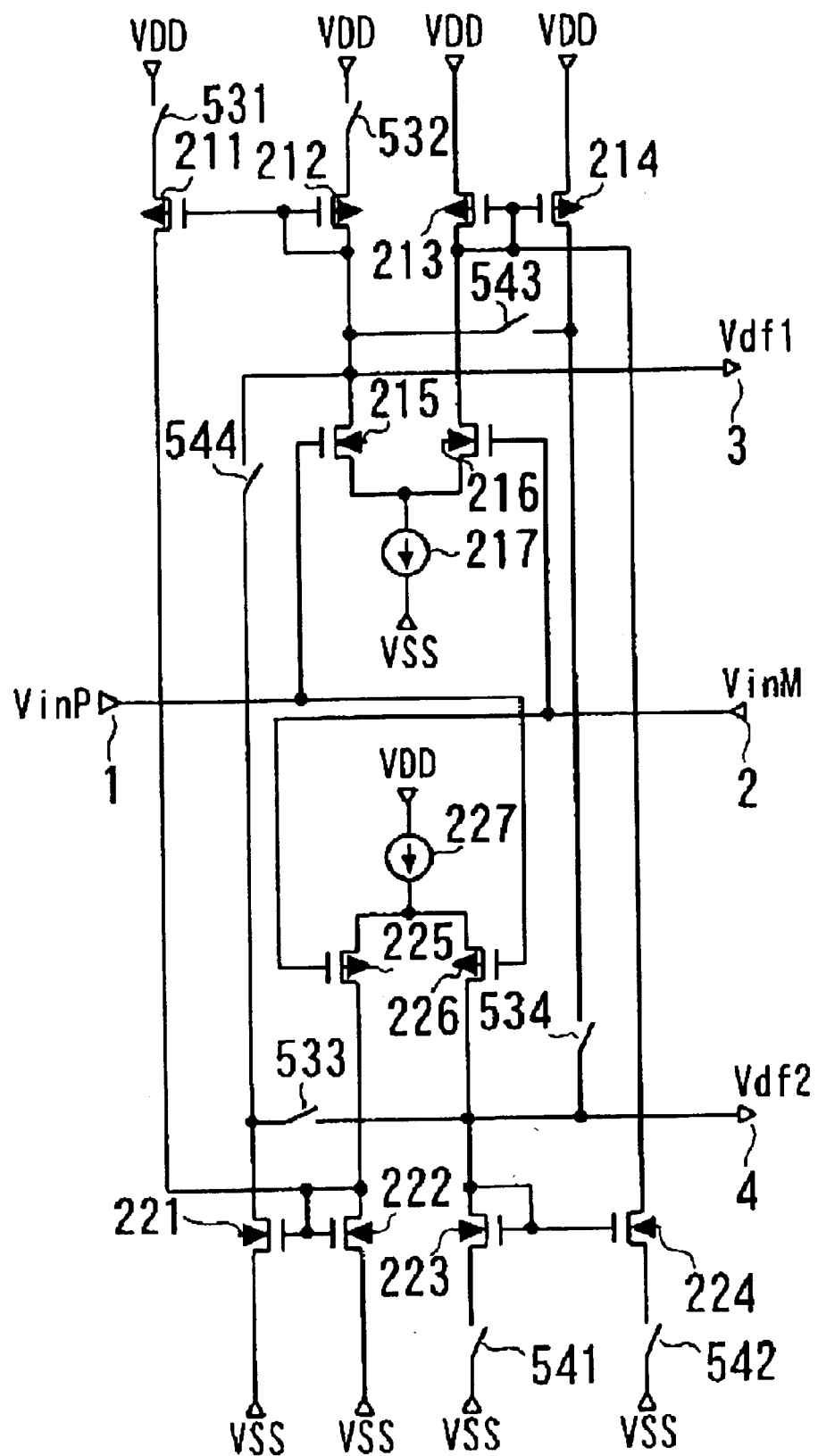
FIG. 4 is a diagram showing a configuration according to a second embodiment of the present invention.

Referring to FIG. 4, another differential circuit according to the present invention includes first and second transistors of first-type conductivity (215 and 216), third and fourth transistors of second-type conductivity (225 and 226), a fifth transistor of second-type conductivity (212), a sixth transistor of second-type conductivity (213), a seventh transistor of second-type conductivity (211), an eighth transistor of second-type conductivity (214), a ninth transistor of first-type conductivity (222), a tenth transistor of first-type conductivity (223), an eleventh transistor of first-type conductivity (221), a twelfth transistor of first-type conductivity (224), a ninth switch (532), a tenth switch (531), an eleventh switch (541), a twelfth switch (542), a thirteenth switch (543), a fourteenth switch (544), a fifteenth switch (533), and a sixteenth switch (534). The sources of the first and second transistors (215 and 216) are commonly connected for connection to a constant-current source (217), and the first and second transistors (215 and 216) receive input voltages VinP and VinM at their gates, respectively to form a differential pair. The sources of the third and fourth transistors (225 and 226) are commonly connected for connection to a second constant-current source (227), and the third and fourth transistors (225 and 226) receive the VinM and the VinP at their gates, respectively to form the differential pair. The source of the fifth transistor (212) is connected to a first power supply (VDD) through the ninth switch (532), and the drain and the gate of the fifth transistor (212) are connected to the drain of the first transistor (215). The source of the sixth transistor (213) is connected to the first power supply VDD, and the drain and the gate of the first transistor (213) are connected to the drain of the second transistor (216). The source of the seventh transistor (211) is connected to the first power supply (VDD) through the tenth switch (531), and the gate of the seventh transistor (211) is connected to the gate of the fifth transistor (212). The source of the eighth transistor (214) is connected to the first power supply (VDD) and the gate of the eighth transistor (214) is connected to the gate of the sixth transistor (213). The source of the ninth transistor (222) is connected to a second power supply (VSS), and the drain of the ninth transistor (222) is connected to the drain of the third transistor (225). The source of the tenth transistor (223) is connected to the second power supply (VSS) through the eleventh switch (541), and the drain and the gate of the tenth transistor (223) are connected to the drain of the fourth transistor (226). The source of the eleventh transistor (221) is connected to the second power supply (VSS), and the gate of the eleventh transistor (221) is connected to the gate of the ninth transistor (222). The source of the twelfth transistor (224) is connected to the second power supply (VSS) through the twelfth switch (542), and the gate of the twelfth transistor is connected to the gate of the tenth transistor (223). The thirteenth switch (543) is connected between the drains of the first and eighth transistors (215 and 214). The fourteenth switch (544) is connected between the drains of the first and eleventh transistors (215 and 221). The fifteenth switch (533) is connected between the drains of the fourth and eleventh transistors (226 and 221). The sixteenth switch (534) is connected between the drains of the fourth and eighth transistors (226 and 214). The drain of the seventh transistor (211) is connected to the drain of the third transistor (225), and the drain of the twelfth transistor (224) is connected to the drain of the second transistor (216). The first differential output (Vdf1) is outputted from the drain (terminal 3) of the first transistor (215), and the second differential output (Vdf2) is outputted from the drain (terminal 4) of the fourth transistor (226). The differential circuit further includes control means for controlling at least one of the first differential output (Vdf1) and the second differential output (Vdf2) to be deactivated.

In the differential circuit according to the present invention, control over changeover between a first connection state and a second connection state is performed. In the first connection state, the ninth, tenth, fifteenth, and sixteenth switches (532, 531, 533, and 534) are made nonconductive, and the eleventh, twelfth, thirteenth, and fourteenth switches (541, 542, 543, and 544) are made conductive. Further, the first differential output (Vdf1) is activated, while the second differential output (Vdf2) is deactivated. In the second connection state, the ninth, tenth, fifteenth, and sixteenth switches (532, 531, 533, and 534) are made conductive, and the eleventh, twelfth, thirteenth, and fourteenth switches (541, 542, 543, and 544) are made nonconductive. The first differential output (Vdf1) is deactivated, while the second differential output (Vdf2) is activated.

Figure 6:
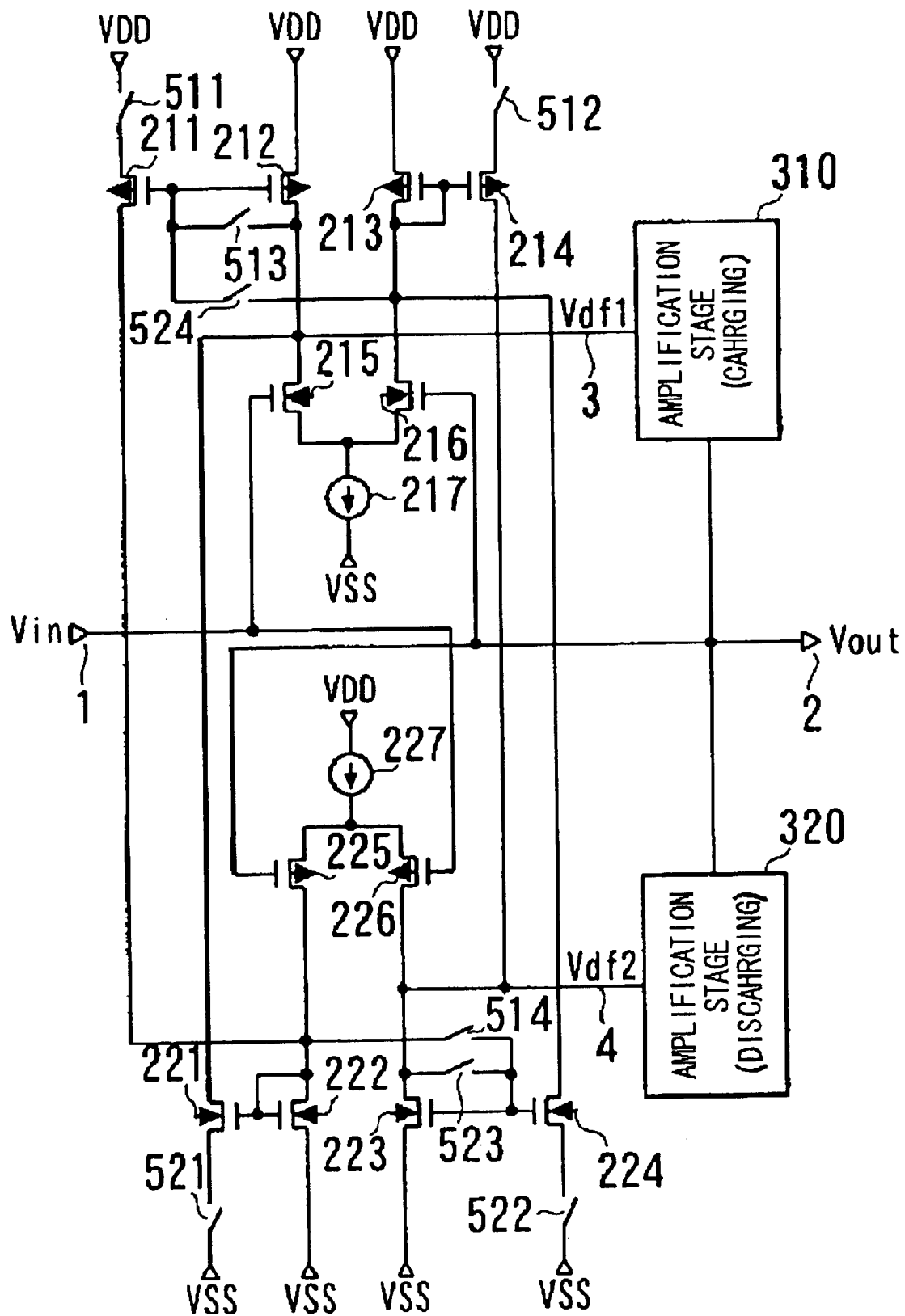
FIG. 6 is a diagram showing a configuration of a third embodiment of the present invention.

Referring to FIG. 6, an amplifier circuit (driver circuit) according to the present invention differentially receives an input terminal voltage (Vin) and an output terminal voltage (Vout), and includes:

a charging amplification stage (310) for charging an output terminal (2) at high speed based on the first differential output (Vdf1) of the differential circuit; and a discharging amplification stage (320) for discharging the output terminal (2) at high speed based on the second differential output (Vdf2) of the differential circuit. The output terminal voltage Vout is fed back to an inverting input terminal of the differential circuit.

Figure 8:
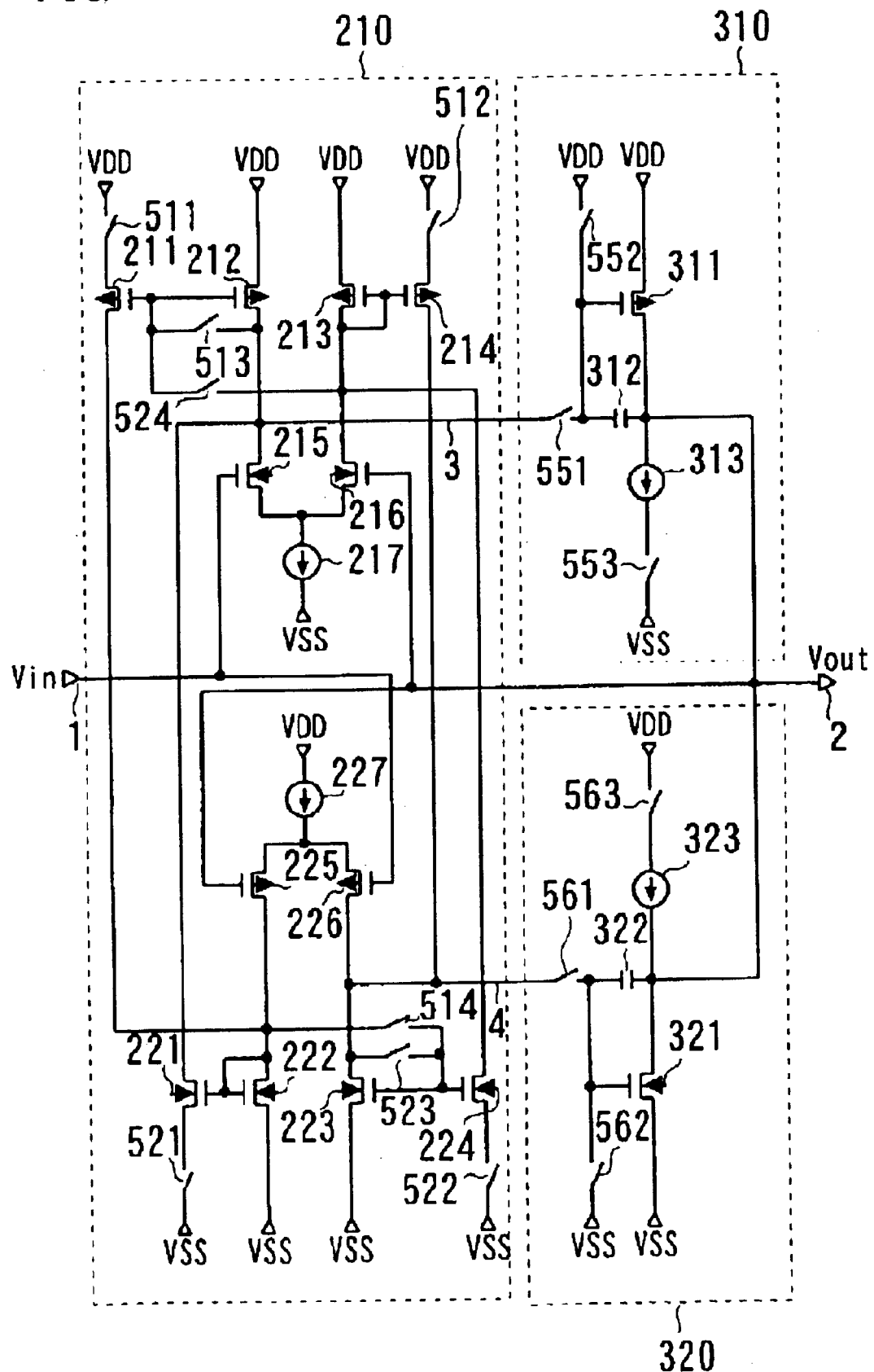
FIG. 8 is a diagram showing a configuration of a fourth embodiment of the present invention.

Referring to FIG. 8, in an amplifier circuit according to the present invention in a preferred mode, a charging amplification stage (310) includes a thirteenth transistor (311), switches (551 and 552), a switch (553), a constant-current source (313), and a capacitor (312). The source of the thirteenth transistor (311) is connected to a high-potential power supply (VDD), the drain of the thirteenth transistor (311) is connected to the output terminal (2), and the gate of the thirteenth transistor (311) receives the first differential output (Vdf1) of the differential circuit (210). The switches (551 and 552) are provided between the gate of the thirteenth transistor (311) and a first output terminal (3) of the differential circuit, and between the gate of the thirteenth transistor (311) and the high-potential power supply (VDD), respectively. The switch (553) and the current source (313) are connected in series between the drain of the thirteenth transistor (311) and a low-potential power supply (VSS). The capacitor (312) is connected between the output terminal (2) and the gate of the thirteenth transistor (311).

A discharging amplification stage (320) includes a fourteenth transistor (321), switches (561 and 562), a switch (563), a current source (323), and a capacitor (322). The source of the fourteenth transistor (321) is connected to the low-potential power supply (VSS). The drain of the fourteenth transistor (321) is connected to the output terminal (2), and the gate of the thirteenth transistor (321) receives the second differential output (Vdf2) of the differential circuit. The switches (561, 562) are provided between the gate of the fourteenth transistor (321) and the second output terminal (4) of the differential circuit, and the gate of the fourteenth transistor (321) and the low-potential power supply (VSS), respectively. The switch (563) and the current source (323) are connected in series between the drain of the fourteenth transistor (321) and the high-potential power supply (VDD). The capacitor (322) is connected between the output terminal (2) and the gate of the fourteenth transistor (321). The amplifier circuit further includes control means for controlling at least one of the charging amplification stage (310) and the discharging amplification stage (320) to be deactivated.

Figure 10:
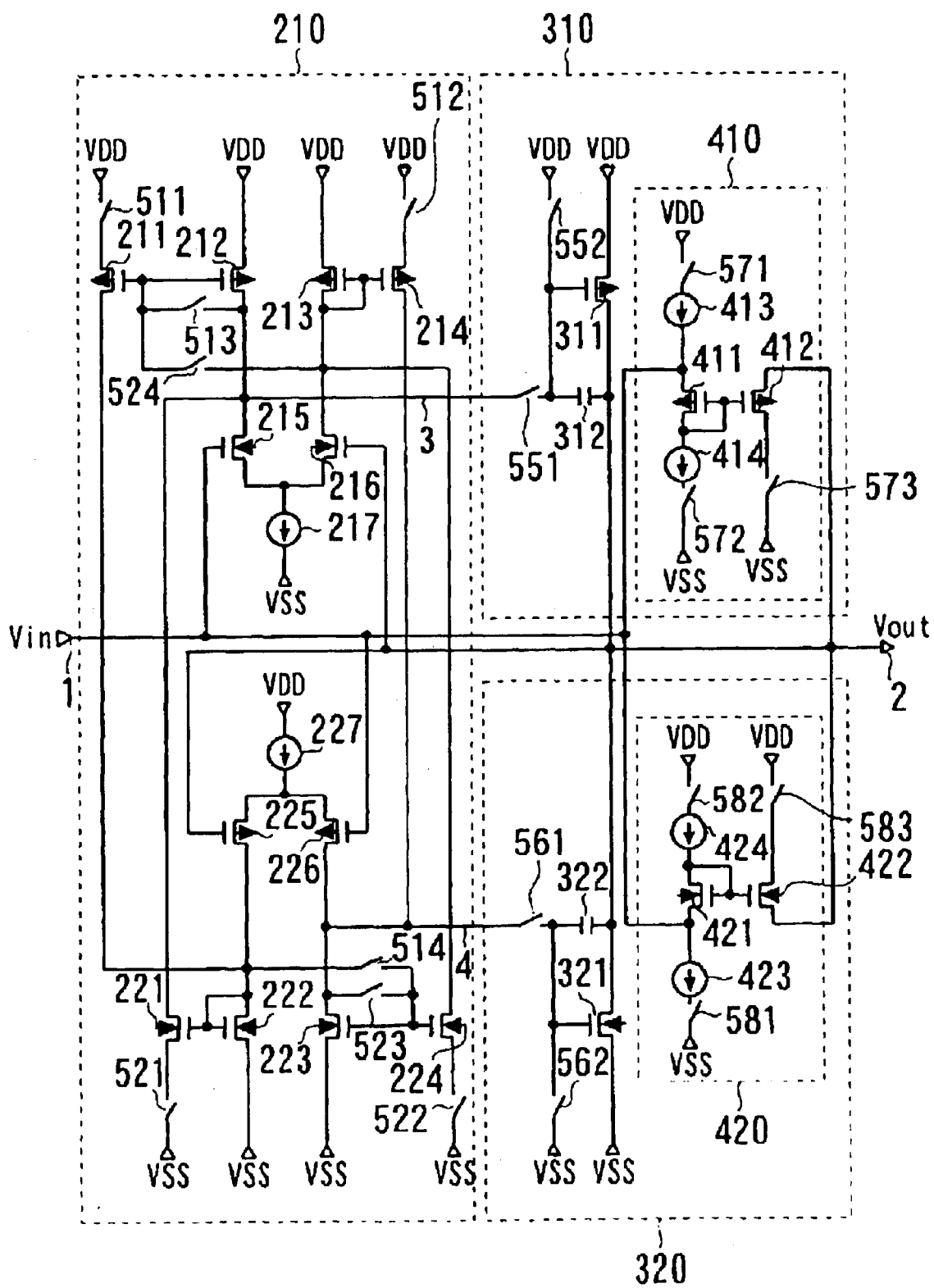
FIG. 10 is a diagram showing a configuration of a fifth embodiment of the present invention.

Referring to FIG. 10, in an amplifier circuit (driver circuit) according to the present invention in a preferred mode, a charging amplification stage (310) includes a charging circuit (311) for charging the output terminal (2) based on the first differential output (Vdf1) of the differential circuit (210) and a follower-type discharging circuit (410) for discharging the output terminal (2) by a follower operation of an active device according to a voltage difference between the input terminal voltage (Vin) and the output terminal voltage (Vout). The follower-type discharging circuit (410) includes first bias control means (a transistor 411, a current source 414) for controlling an output bias voltage in response to the input terminal voltage (Vin) and a follower transistor (412) connected between the output terminal (2) and a low-potential power supply (VSS), for receiving the bias voltage supplied from the first bias control means.

A discharging amplification stage (320) includes a discharging circuit (321) for discharging the output terminal (2) based on the second differential output (Vdf2) of the differential circuit (210) and a follower-type charging circuit (420) for charging the output terminal (2) by the follower operation of an active device according to the voltage difference between the input terminal voltage (Vin) and the output terminal voltage (Vout). The follower-type charging circuit (420) includes second bias control means (421, a current source 424) for controlling the output bias voltage in response to the input terminal voltage (Vin) and a follower transistor (422) connected between a high-potential power supply (VDD) and the output terminal (2), for receiving the bias voltage from the second bias control means.

Referring to FIG. 10 and more specifically, the amplifier circuit (driver circuit) according to the present invention in the preferred mode includes the charging circuit that has the thirteenth transistor (311) connected between the high-potential power supply VDD and the output terminal (2), for receiving the first differential output (Vdf1) of the differential circuit (210) at its gate, and the follower-type discharging circuit (410). The follower-type discharging circuit (410) includes the follower-structured fifteenth transistor (412) connected between the output terminal (2) and the low-potential power supply (VSS), and the diode-connected seventeenth transistor (411) inserted between the input terminal (1) and the low-potential power supply (VSS), driven by the constant-current source (414), of which the gate is connected to the gate of the follower-structured transistor (412).

The amplifier circuit further includes the discharging circuit that has a fourteenth transistor (321) connected between the low-potential power supply (VSS) and the output terminal (2), for receiving the second differential output (Vdf2) of the differential circuit at its gate, and the follower-type charging circuit (420). The follower-type charging circuit (420) has the follower-structured sixteenth transistor (422) connected between the output terminal (2) and the high-potential power supply (VDD), and the diode-connected eighteenth transistor (421) inserted between a high-potential power supply and the input terminal (1), driven by the constant-current source (424), of which the gate is connected to the gate of the follower-structured sixteenth transistor (422).

The amplifier circuit includes control means for controlling at least one of the charging circuit (311) and the discharging circuit (321) to be deactivated, and controlling activation of the follower-type discharging circuit (410) and deactivation of the follower-type charging circuit (420) and activation of the follower-type charging circuit (420) and deactivation of the follower-type discharging circuit (410).

The amplifier circuit further includes switches (551 and 552) between the gate of the thirteenth transistor (311) and first output terminal (3) of the differential circuit, and between the gate of the thirteenth transistor (311) and the high-potential power supply (VDD), and a capacitor (312) between the gate of the thirteenth transistor (311) and the output terminal (2).

The amplifier circuit includes a switch (573) between the follower-structured fifteenth transistor (412) and the low-potential power supply, a switch (572) connected to the constant-current source (414) in series between the seventh transistor (411) and a low-potential power supply, and a switch (571) and a constant-current source (413) between the seventeenth transistor (411) and a high-potential power supply.

The amplifier circuit further includes switches (561 and 562) between the gate of the fourteenth transistor (321) and the second output terminal (4) of the differential circuit, and between the gate of the fourteenth transistor (321) and the low-potential power supply (VSS), respectively, and a capacitor (322) between the gate of the fourteenth transistor (321) and the output terminal (2).

The amplifier circuit includes a switch (583) between the follower-structured sixteenth transistor (422) and the high-potential power supply, a switch (582) connected in series with the constant-current source (424) between the eighteenth transistor (421) and the high-potential power supply (VDD), and a switch (581) and a constant-current source (423) between the eighteenth transistor (421) and the low-potential power supply (VSS).

Figure 12:
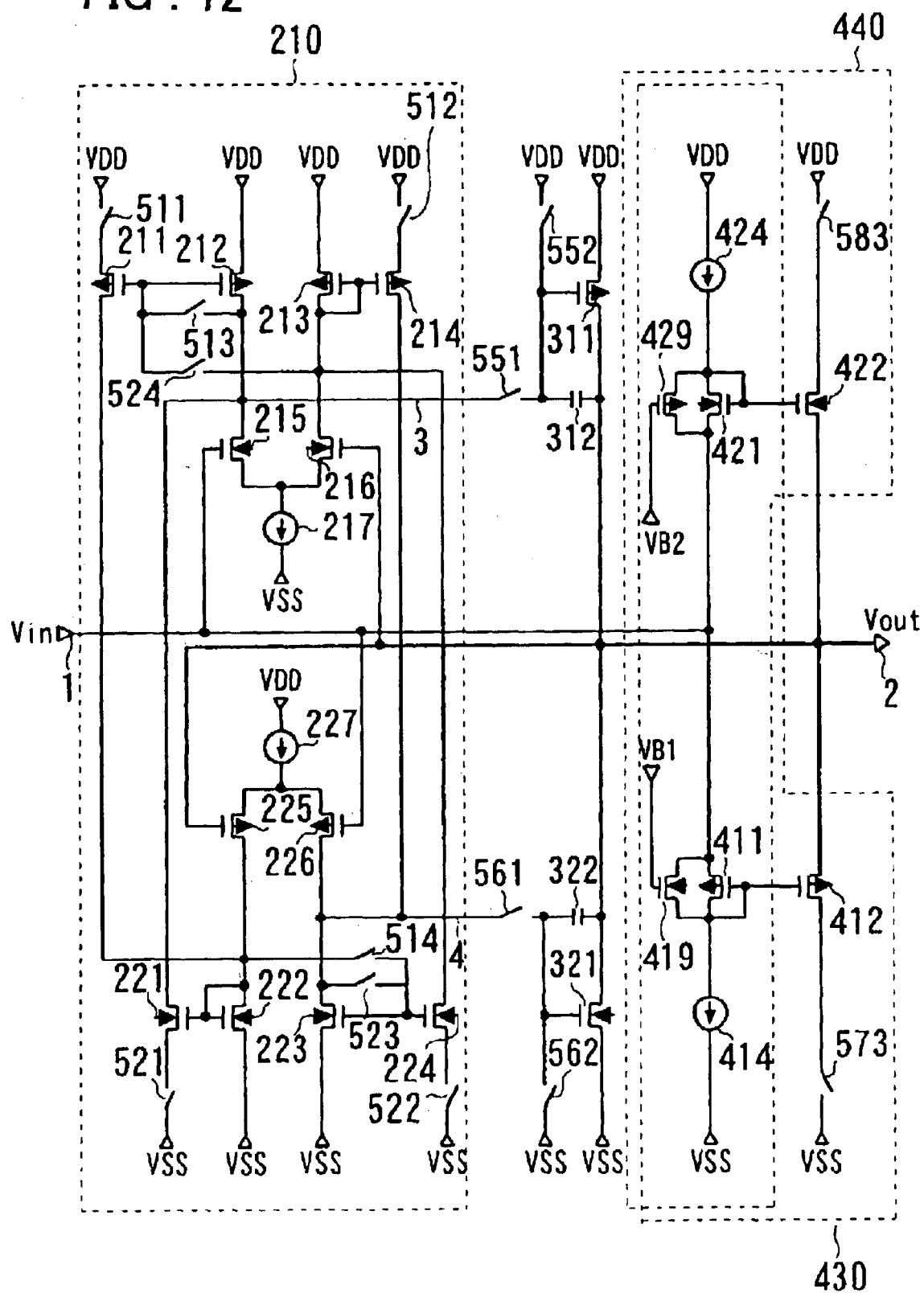
FIG. 12 is a diagram showing a variation of the fifth embodiment of the present invention.

Alternatively, referring to FIG. 12, a circuit for supplying bias to the gate of the follower-structured fifteenth transistor (412) includes the diode-connected seventeenth transistor (411) and the current source (414) connected between the input terminal (1) and the low-potential power supply (VSS), and the nineteenth transistor (419) connected in parallel with the seventeenth transistor (411), for receiving a first bias voltage (VB1). The gate of the seventeenth transistor (411) and the gate of the fifteenth transistor (412) are commonly connected. On the other hand, referring to FIG. 12, the circuit for supplying bias to the gate of the follower-structured sixteenth transistor (422) includes the diode-connected nineteenth transistor (421) and the current source (424) connected between the input terminal (1) and the high-potential power supply (VDD), and a twentieth transistor (429) connected in parallel with the eighteenth transistor (421), for receiving a second bias voltage at its gate. The gate of the eighteenth transistor (421) and the gate of the sixteenth transistor (422) are commonly connected.

Figure 14:
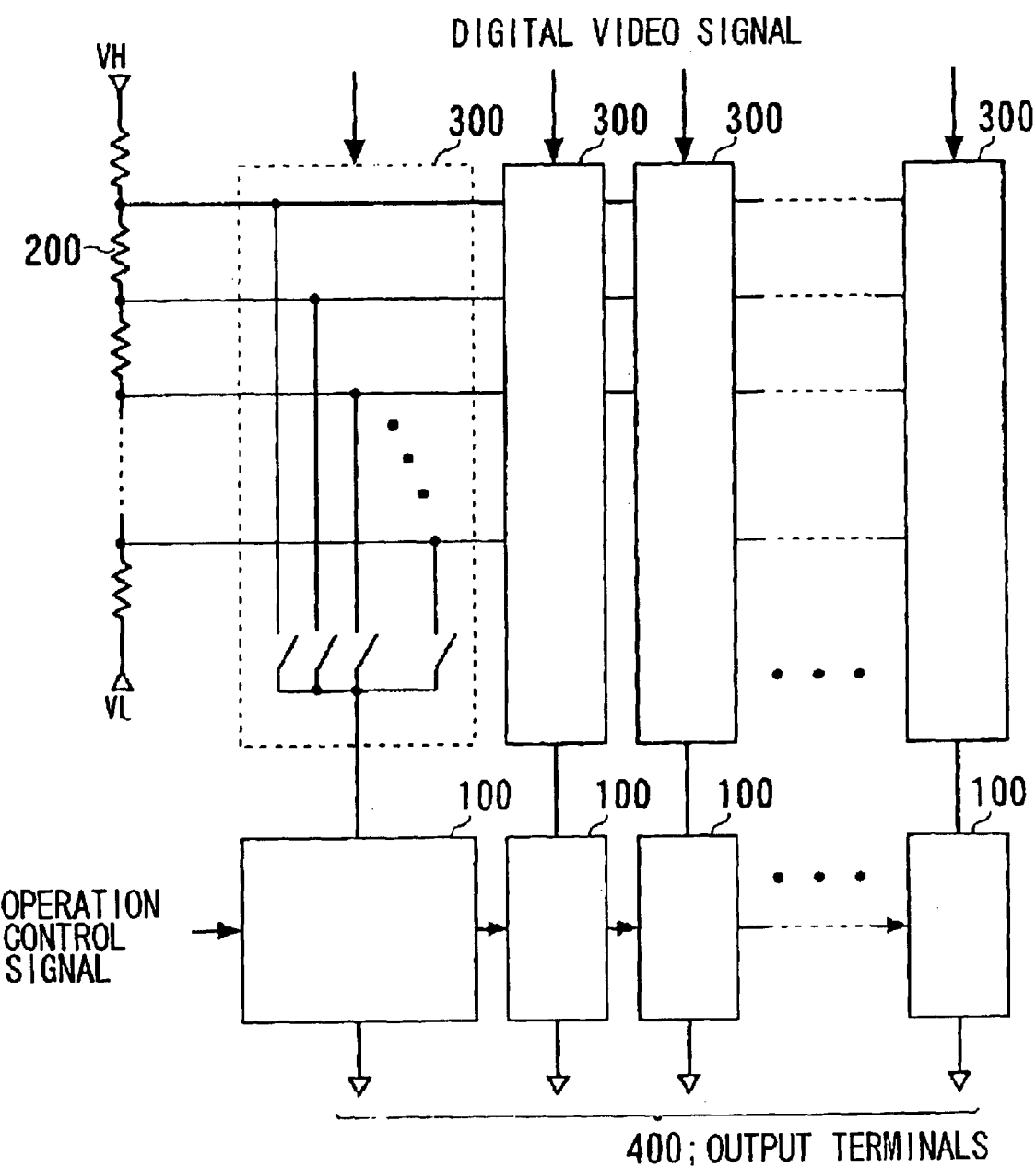
FIG. 14 is a diagram showing a configuration of a sixth embodiment of the present invention.

Referring to FIG. 14, a display circuit according to the present invention includes above-mentioned amplifier circuits each having the differential circuit, charging amplification stage, and discharging amplification stage, in the form of output circuits (100) for driving data lines, for example.

In order to describe the mode for practicing the present invention in further detail, embodiments of the present invention will be described with reference to drawings. FIG. 1 is a diagram showing a first embodiment of the present invention.

Referring to FIG. 1, a differential circuit according to this embodiment includes n-channel transistors 215 and 216, p-channel transistors 211, 212, 213 and 214, a constant-current source 217 and switches 511, 512, 513 and 524 and outputs a first differential output Vdf1 from a drain of the n-channel transistor 215.

Sources of the n-channel transistors 215 and 216 are commonly connected to the constant-current source 217, and the n-channel transistors 215 and 216 receive input voltages VinP and VinM at their gates, respectively to form a differential pair. The source of the p-channel transistor 212 is connected to a power supply VDD, and a drain of the p-channel transistor 212 is connected to the drain of the n-channel transistor 215. The source of the p-channel transistor 213 is connected to the power supply VDD, and the drain and the gate of the p-channel transistor 213 are connected to the drain of the n-channel transistor 216. The sources of the p-channel transistors 211 and 214 are connected to the power supply VDD through switches 511 and 512, respectively, and gates of the p-channel transistors 211 and 214 are connected to the gates of the p-channel transistors 212 and 213, respectively. The switch 513 is connected between a common gate of the p-channel transistors 211 and 212 and the drain of the n-channel transistor 215. The switch 524 is connected between the common gate of the p-channel transistors 211 and 212 and the drain of the n-channel transistor 216.

The differential circuit further includes p-channel transistors 225 and 226, n-channel transistors 221, 222, 223 and 224, a constant-current source 227 and switches 514, 521, 522 and 523, and outputs a second differential output Vdf2 from the drain of the p-channel transistor 226.

The sources of the p-channel transistors 225 and 226 are commonly connected to the constant-current source 227, and the p-channel transistors 225 and 226 receive VinM and VinP at their gates, respectively, to form a differential pair. The source of the n-channel transistor 222 is connected to a power supply VSS, and the drain and the gate of the n-channel transistor 222 are connected to the drain of the p-channel transistor 225. The source of the n-channel transistor 223 is connected to the power supply VSS, and the drain of the n-channel transistor 223 is connected to the drain of the p-channel transistor 226. The sources of the n-channel transistors 221 and 224 are connected to the power supply VSS through the switches 521 and 522, respectively, and the gates of the n-channel transistors 221 and 224 are connected to the gates of the n-channel transistors 222 and 223, respectively. The switch 514 is connected between the common gate of the n-channel transistors 223 and 224 and the drain of the p-channel transistor 225. The switch 523 is connected between the common gate of the n-channel transistors 223 and 224 and the drain of the p-channel transistor 226. The drains of the p-channel transistors 211 and 214 are connected to the drains of the p-channel transistors 225 and 226, respectively. The drains of the n-channel transistors 221 and 224 are connected to the drains of the n-channel transistors 215 and 216, respectively. The differential circuit further includes control means for controlling at least one of the first differential output (Vdf1) and the second differential output (Vdf2) to be deactivated.

In this manner, the differential circuit according to this embodiment includes an n-channel differential pair (215, 216) driven by the constant-current source 217, a p-channel differential pair (225, 226) driven by the constant-current source 227, the p-channel transistors (211, 212, 213 and 214) capable of constituting two sets of current mirror circuits, the n-channel transistors (221, 222, 223 and 224) capable of constituting two sets of current mirror circuits, and connection changeover means (switches 511 to 514, 521 to 524). The differential circuit that operates in wide input and output ranges with two input voltages VinP and VinM as differential inputs can be switched between two polarity symmetric differential circuits by connection changeover means. With regard to states of the two polarity symmetric differential circuits, in a first connection state, the p-channel transistors 212 and 213 are selected from the p-channel transistors (211, 212, 213, and 214) by the connection changeover means to form the current mirror circuit that functions as a load circuit for the n-channel differential pair (215, 216). The n-channel transistors (221, 222, 223, and 224) constitute a current mirror circuit (221 and 222) and a current mirror circuit (223 and 224), of which input terminals are connected to a pair of outputs of the p-channel differential pair (225, 226), respectively. In a second connection state, the n-channel transistors 222 and 223 are selected from the n-channel transistors (221, 222, 223 and 224) to form the current mirror circuit that functions as the load circuit for the p-channel differential pair (225, 226). The p-channel transistors (211, 212, 213 and 214) constitute two current mirror circuit that include a current mirror circuit (211, 212) and a current mirror circuit (213, 214) of which the input terminals are connected to a pair of the outputs of the n-channel differential pair (215, 216).

Figure 3A:
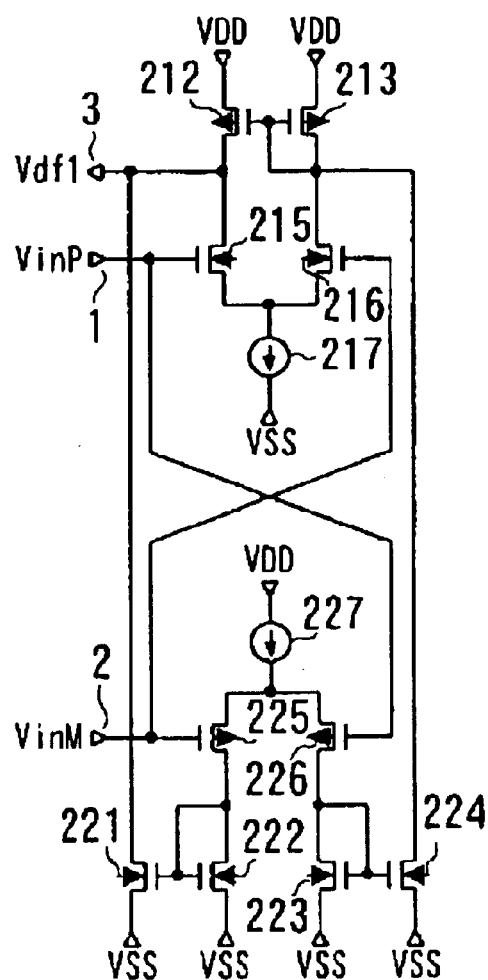
FIGS. 3A and 3B includes diagrams showing equivalent circuits in first and second connection changeovers according to the first embodiment of the present invention.
Figure 3B:
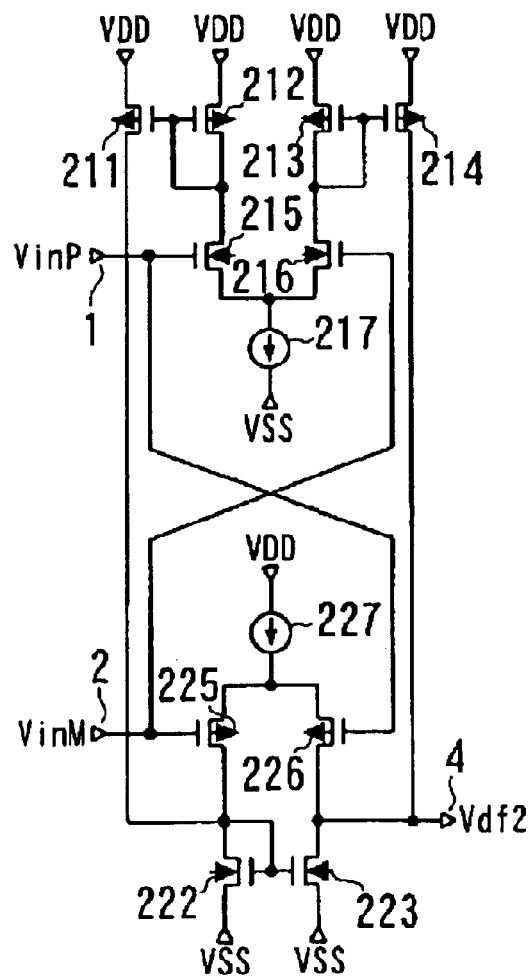

FIG. 2 is a table for explaining how to control the respective switches in FIG. 1, which constitute the connection changeover means, and how to control activation and deactivation of the first differential output Vdf1 and the second differential output Vdf2. FIG. 2 shows two connection states (a first connection changeover, a second connection changeover) by the connection changeover means. FIGS. 3A and 3B show equivalent circuits in the two connection states (the first connection changeover, the second connection changeover) for the differential circuit in FIG. 1. A deactivation state of the differential output Vdf1 or the second differential output Vdf2 in the present invention means a state in which they are not outputted to an outside of the differential circuit.

In the first connection changeover, the switches 511, 512, 513, and 514 are turned off, and the switches 521, 522, 523, and 524 are turned on. Further, the first differential output Vdf1 is activated, while the second differential output Vdf2 is deactivated.

In this state, the gate of the p-channel transistor 212 is connected to the gate and the drain of the p-channel transistor 213. The p-channel transistors 212 and 213 thereby form the current mirror circuit with its input terminal being a connection point between the gate and drain of the transistor 213 and its output terminal being the drain of the transistor 212, which functions as a load circuit for the differential pair (215, 216). Further, the n-channel transistors 221 and 221 form the current mirror circuit with its input terminal being a connection point between the gate and the drain of the transistor 222 and its output terminal being the drain of the transistor 221. The gate and the drain of the n-channel transistor 223 are connected. The n-channel transistors 223 and 224 thereby form the current mirror circuit with its input terminal being a connection point between the gate and the drain of the transistor 223 and its output terminal being the drain of the transistor 224. Further, the p-channel transistors 211 and 214 are deactivated by turning off of the switches 511 and 512. At this point, the output of the differential circuit becomes the voltage output Vdf1 from a terminal 3 connected to a common drain terminal of the transistors 212 and 215. Accordingly, the equivalent circuit in the first connection changeover becomes a configuration shown in FIG. 3A, and the current mirror circuit (212, 213) constitutes the load circuit for the n-channel differential pair (215, 216) and also constitutes the load circuit for the current mirror circuit (221, 222) and the current mirror circuit (223, 224) that mirror the output currents of the p-channel differential pair (225, 226), respectively.

On the other hand, in the second connection changeover, the switches 511, 512, 513, and 514 are turned on, and the switches 521, 522, 523, and 524 are turned off. Further, the first differential output Vdf1 is deactivated, while the second differential output Vdf2 is activated.

At this point, the gate of the n-channel transistor 223 is connected to the gate and the drain of the n-channel transistor 222. The n-channel transistors 222 and 223 thereby form the current mirror circuit with its input terminal being a connection point between the gate and drain of the transistor 222 and its output terminal being the drain of the transistor 223, which functions as a load circuit for the differential pair (225, 226). Further, the gate and the drain of the p-channel transistor 212 are connected. The p-channel transistors 211 and 212 thereby form the current mirror circuit with its input terminal being a connection point between the gate and the drain of the transistor 212 and its output terminal being the drain of the transistor 211. The p-channel transistors 213 and 214 forms the current mirror circuit with its input terminal being a connection point between the gate and the drain of the transistor 213 and its output terminal being the drain of the transistor 214. Further, the n-channel transistors 221 and 224 are deactivated by turning off of the switches 521 and 522. At this point, the output of the differential circuit becomes the voltage output Vdf2 from a terminal 4 connected to the common drain terminal of the transistors 223 and 226. Accordingly, the equivalent circuit in the second connection changeover becomes a configuration shown in FIG. 3B, and the current mirror circuit (222, 223) constitutes a load circuit for the p-channel differential pair (225, 226) and also constitutes the load circuit for the current mirror circuit (211, 212) and the current mirror circuit (213, 214) that mirror the output currents of the n-channel differential pair (215, 216), respectively.

The equivalent circuits in the two connection states (the first connection changeover, the second connection changeover), shown in FIGS. 3A and 3B, are polarity symmetric differential circuits of which one equivalent circuit becomes the same as the other equivalent circuit if changeover of the conductivities of the respective transistors and changeover of the VDD and the VSS in the one equivalent circuit is performed. In other words, the polarity symmetry of the differential circuit in FIG. 1 can be readily changed over by the connection switching means (switches 511 to 514 and 521 to 524). Incidentally, since the differential circuit provided with these changeover means can be composed by devices fewer than in the differential circuit constituted by providing the two equivalent circuits separately, the differential circuit is space-saving.

Next, an operation of the differential circuit in FIG. 1 will be described. For simplifying a description, a pair of transistors that constitutes a differential pair and a current mirror circuit is assumed to have the same transistor characteristics, and a state where the two differential input voltages VinP and VinM are equal is assumed to be a reference state.

In the first connection changeover and in the reference state where the VinP is equal to the VinM, currents that flow through the p-channel differential pair (225, 226) are equal to each other. Half of the current of the constant-current source 227 flows through each of the transistors 225 and 226. The currents of the transistors 225 and 226 flow through the transistors 221 and 224, respectively, in same magnitude as mirror currents, due to the current mirror circuit (221, 222) and the current mirror circuit (223, 224). Further, currents that flow through the n-channel differential pair (215, 216) are equal to each other. Half of the current of the constant-current source 217 flows through each of the transistors 215 and 216. On the other hand, currents of the current mirror circuit (212, 213) are equal to each other. A sum of the halves of the currents of the constant-current sources 217 and 227 flows through each of the transistors 212 and 213. Currents that flow through each pair of the transistors are equal to each other in this manner, so that the voltages at the respective terminals of the pair of the transistors are also equal to each other. The first output Vdf1 of the differential circuit (a drain output of the transistor 212) becomes substantially equal to a drain voltage (a gate voltage) of the transistor 213.

When the differential input voltage VinP becomes larger than the differential input voltage VinM, a gate-source voltage of the transistor 215 increases and the gate-source voltage of the transistor 216 decreases at the differential pair (215, 216), which functions to cause much current to flow through the transistor 215. For this reason, a discharging operation of the transistor 215 becomes strong, thereby causing the first output Vdf1 of the differential circuit to be reduced. On the other hand, the gate-source voltage of the transistor 225 increases and the gate-source voltage of the transistor 226 decreases at the differential pair of the transistors 225 and 226, which functions to cause much current to flow through the transistor 225, so that the current of the transistor 221 through which its mirror current flows increases. For this reason, the discharging operation of the transistor 221 becomes strong, thereby causing the first output Vdf1 of the differential circuit to be reduced.

In this manner, when the VinP becomes larger than the VinM, the first output Vdf1 is reduced. The larger a voltage difference between the VinP and the VinM is, the larger the Vdf1 changes.

When the differential input voltage VinP becomes smaller than the differential input voltage VinM, the gate-source voltage of the transistor 216 increases and the gate-source voltage of the transistor 215 decreases at the differential pair (215, 216). Thus, the discharging operation of the transistor 215 becomes weak, which functions to increase the first output Vdf1 of the differential circuit. On the other hand, the gate-source voltage of the transistor 226 increases and the gate-source voltage of the transistor 225 decreases at the differential pair (225, 226), which functions to limit the current of the transistor 225, so that the current of the transistor 221 through which its mirror current flows also decreases. For this reason, the discharging operation of the transistor 221 becomes weak, thereby causing the first output Vdf1 of the differential circuit to increase. In this manner, when the VinP becomes smaller than the VinM, the first output Vdf1 increases. Incidentally, the larger the voltage difference between the VinP and the VinM is, the larger the Vdf1 changes.

Incidentally, when the input voltages VinP and VinM are sufficiently close to a power supply voltage, the differential pairs of the transistors are turned off, so that the differential pair (215, 216) or the differential pair (225, 226) stops operation. However, if one of the differential pairs functions, the first output Vdf1 of the differential circuit normally operates according to the voltage difference between the VinP and VinM.

On the other hand, normally, the second output Vdf2 of the differential circuit (a voltage at a connection point between drain terminals of the transistors 223 and 226) scarcely changes according a change in the differential input voltages VinP and VinM, because the transistor 223 is diode-connected. Further, when the VinP and the VinM are sufficiently close to a high-potential power supply voltage VDD, the differential pair (225, 226) stops, so that the Vdf2 becomes a low-potential power supply voltage VSS.

In the second connection changeover and in the reference state where the VinP is equal to the VinM, currents that flow through the n-channel differential pair (215, 216) are equal to each other. Half of the current of the constant-current source 217 flows through each of the transistors 215 and 216. The currents of the transistors 215 and 216 flow through the transistors 211 and 214, respectively, in the same magnitude, as mirror currents due to the current mirror circuit (211, 212) and the current mirror circuit (213, 214). Further, currents that flow through the p-channel differential pair (225, 226) are also equal to each other. Half of the current of the constant-current source 227 flows through each of the transistors 225 and 226. On the other hand, currents of the current mirror circuit (222, 223) are equal to each other. A sum of the halves of the currents of the constant-current sources 217 and 227 flows through each of the transistors 222 and 223. Currents that flow through each pair of the transistors are equal to each other in this manner, so that the voltages at the respective terminals of the pair of the transistors are also equal to each other. The second output Vdf2 of the differential circuit (the drain output of the transistor 223) becomes substantially equal to the drain voltage (gate voltage) of the transistor 222.

When the differential input voltage VinP becomes larger than the differential input voltage VinM, the gate-source voltage of the transistor 225 increases and the gate-source voltage of the transistor 226 decreases at the differential pair (225, 226), which functions to limit the current of the transistor 226. For this reason, the charging operation of the transistor 226 becomes weak to reduce the second output Vdf2 of the differential circuit. On the other hand, the gate-source voltage of the transistor 215 increases and the gate-source voltage of the transistor 216 decreases at the differential pair (215, 216), which functions to limit the current of the transistor 214, so that the current of the transistor 214 through which its mirror current flows decreases. For this reason, the charging operation of the transistor 214 becomes weak, thereby also causing the second output Vdf2 of the differential circuit to be reduced. In this manner, when the VinP becomes larger than the VinM, the second output Vdf2 of the differential circuit decreases. Further, the larger the voltage difference between the VinP and the VinM, the larger the Vdf2 changes.

When the differential input voltage VinP becomes smaller than the differential input voltage VinM, the gate-source voltage of the transistor 226 increases and the gate-source voltage of the transistor 225 decreases at the differential pair (225, 226). Thus, the charging operation of the transistor 226 becomes strong, thereby causing the second output Vdf2 of the differential circuit to increase. On the other hand, the gate-source voltage of the transistor 216 increases and the gate-source voltage of the transistor 215 decreases at the differential pair (215, 216), which functions to cause much current to flow through the transistor 216, so that the current of the transistor 214 through which its mirror current flows also increases. For this reason, the charging operation of the transistor 214 becomes strong, thereby also causing the second output Vdf2 of the differential circuit to increase. In this manner, when the VinP becomes smaller than the VinM, the second output Vdf2 of the differential circuit increases. Incidentally, the larger the voltage difference between the VinP and the VinM is, the larger the Vdf2 changes.

Incidentally, when the input voltages VinP and VinM are sufficiently close to the power supply Voltage, the differential pair (215, 216) or the differential pair (225, 226) stops functioning. However, if either one of the differential pairs functions, the second output Vdf2 of the differential circuit normally operates according to the voltage difference between the VinP and VinM. On the other hand, normally, the first output Vdf1 of the differential circuit (a voltage at a connection point between the drain terminals of the transistors 212 and 215) scarcely changes according a change in the differential input voltages VinP and VinM, because the transistor 212 is diode-connected. Further, when the VinP and the VinM are sufficiently close to the low-potential power supply voltage VSS, the differential pair (215, 216) stops, so that the Vdf1 becomes the high-potential power supply voltage VDD.

Potentials of output signals Vdf1 and Vdf2 of the differential circuit in the reference state are different. A potential level of the Vdf1 relative to the high-potential power supply voltage VDD in the reference state is a level comparatively close to a threshold voltage of the p-channel transistor. On the other hand, the potential level of the output signal Vdf2 relative to the low-potential power supply voltage VSS is a level comparatively close to the threshold voltage of the n-channel transistor.

Assume that the switches 511, 512, 521, and 522 are composed by transistors. Since one end of each switch is a power supply, it is possible to employ pass-transistor switches each composed by a single transistor (p-channel transistor switches or n-channel transistor switches). Both of ends of the switches 513 and 524 are at the same potential level as the gates of the transistors 212 and 213 while turned on, respectively. If a current flowing through the differential circuit is sufficiently small, the potentials of the gates of the transistors 212 and 213 becomes close to a voltage lower than the power supply voltage VDD just by the p-channel transistor threshold voltage. Accordingly, if the switches 513 and 524 are composed by transistors and the range of the power supply voltage is sufficiently wide relative to the p-channel transistor threshold voltage, the switches 513 and 524 can be composed by the p-channel transistor switches. Likewise, if the switches 514 and 523 are composed by transistors and the power supply voltage range is sufficiently wide relative to the n-channel transistor threshold voltage, the switches 514 and 523 can be composed by the n-channel transistor switches.

FIG. 4 is a diagram showing a configuration according to a second embodiment of the present invention. It is a variation of the first embodiment. Referring to FIG. 4, a differential circuit according to this embodiment includes the n-channel transistors 215 and 216, the p-channel transistors 212 and 213, the p-channel transistors 211 and 214, the constant-current source 217, and switches 531, 532 and 543, and outputs the first differential output Vdf1 from the drain of the n-channel transistor 215. The sources of the n-channel transistors 215 and 216 are commonly connected for connection to the constant-current source 217, and the n-channel transistors 215 and 216 receive the input voltages VinP and VinM at their gates, respectively, to form the differential pair. The source of the p-channel transistor 212 is connected to the power supply VDD through a switch 532, and the drain and the gate of the p-channel transistor 212 is connected to the drain of the n-channel transistor 215. The source of the p-channel transistor 213 is connected to the power supply VDD, and the drain and the gate of the p-channel transistor 213 are connected to the drain of the n-channel transistor 216. The source of the p-channel transistor 211 is connected to the power supply VDD through a switch 531, and the gate of the p-channel transistor 211 is connected to the gate of the p-channel transistor 212. The source of the p-channel transistor 214 is connected to the power supply VDD and the gate of the p-channel transistor 214 is connected to the gate of the p-channel transistor 213. The switch 543 is connected between the drains of the p-channel transistors 212 and 214. The differential circuit further includes the p-channel transistors 225 and 226, the n-channel transistors 222 and 223, the n-channel transistors 221 and 224, the constant-current source 227, and switches 541, 542, 533, 544, and 534. The sources of the p-channel transistors 225 and 226 are commonly connected for connection to the constant-current source 227, and the p-channel transistors 225 and 226 receive the VinM and the VinP at their gates, respectively to form the differential pair. The source of the n-channel transistor 222 is connected to the power supply VSS, and the drain and the gate of the n-channel transistor 222 are connected to the drain of the p-channel transistor 225. The source of the n-channel transistor 223 is connected to the power supply VSS through a switch 541, and the drain and the gate of the n-channel transistor 223 are connected to the drain of the p-channel transistor 226. The source of the n-channel transistor 221 is connected to the power supply VSS, and the gate of the n-channel transistor 221 is connected to the gate of the n-channel transistor 222. The source of the n-channel transistor 224 is connected to the power supply VSS through a switch 542 and the gate of the n-channel transistor 224 is connected to the gate of the n-channel transistor 223. The switch 533 is connected between the drains of the n-channel transistors 221 and 223. The switch 544 is connected between the drains of the n-channel transistors 215 and 221. The switch 534 is connected between the drains of the p-channel transistors 214 and 226. The drain of the p-channel transistor 211 is connected to a connection point between the gate and the drain of the n-channel transistor 222. The drain of the n-channel transistor 224 is connected to a connection point between the gate and the drain of the p-channel transistor 213. The differential circuit outputs the second differential output Vdf2 from the drain of the p-channel transistor 226. The differential circuit further includes control means for controlling at least one of the first differential output Vdf1 and the second differential output Vdf2 to be deactivated.

In this manner, the differential circuit according to this embodiment includes the n-channel differential pair 215, 216 driven by the constant-current source 217, the p-channel differential pair 225, 226 driven by the constant-current source 227, the p-channel transistors (211, 212, 213, and 214) capable of constituting two current mirror circuits, the n-channel transistors (221, 222, 223, and 224) capable of constituting two current mirror circuits, and the connection changeover means (the switches 531 to 534, the switches 541 to 544). The differential circuit that operates in wide input and output ranges with the two input voltages VinP and VinM as the differential inputs can be switched between two states of polarity symmetric configurations by the connection changeover means. With regard to the states of the two polarity symmetric differential circuits, in the first connection state, the p-channel transistors 213 and 214 are selected from the p-channel transistors (211, 212, 213, 214) by the connection changeover means to form the current mirror circuit that functions as the load circuit for the n-channel differential pair 215, 216. The n-channel transistors (221, 222, 223, 224) constitute two current mirror circuits that include the current mirror circuit 221, 222 and the current mirror circuit 223, 224, of which the input terminals are connected to a pair of outputs of the p-channel differential pair 225, 226.

In the second connection state, the n-channel transistors 221 and 222 are selected from the n-channel transistors (221, 222, 223, 224) to form the current mirror circuit that functions as the load circuit for the p-channel differential pair 225, 226. The p-channel transistors (211, 212, 213, 214) constitute two current mirror circuits that include the current mirror circuit 211, 212 and the current mirror circuit 213, 214, of which the input terminals are connected to a pair of the outputs of the n-channel differential pair 215, 216.

FIG. 5 is a table for explaining how to control the respective switches in FIG. 4, which constitute the connection changeover means, and how to control activation and deactivation of the first differential output Vdf1 and the second differential output Vdf2. FIG. 5 shows the two connection states (the first connection changeover and the second connection changeover), by the connection changeover means. In the first connection changeover, the switches 531, 532, 533, and 534 are turned off, and the switches 541, 542, 543, and 544 are turned on. Further, the first differential output Vdf1 is activated, while the second differential output Vdf2 is deactivated.

At this time, the p-channel transistors 213 and 214 compose a current mirror circuit with its input terminal being the connection point between the gate and the drain of the transistor 213 and its output terminal being the drain of the transistor 214, which functions as the load circuit for the differential pair (215, 216). Further, the p-channel transistors 211 and 212 are deactivated by turning off of the switches 531 and 532. Further, the current mirror circuit (213, 214) also functions as the load circuit for the current mirror circuit (221, 222) and the current circuit (223, 224) that mirror the output currents of the p-channel differential pair (225, 226), respectively. Incidentally, the output of the differential circuit becomes the voltage Vdf1 from the terminal 3 connected to the common drain terminal of the transistors 212 and 215.

On the other hand, in the second connection changeover, the switches 531, 532, 533, and 534 are turned on, and the switches 541, 542, 543, and 544 are turned off. Further, the first differential output Vdf1 is deactivated, while the second differential output Vdf2 is activated.

At this time, the n-channel transistors 221 and 222 form the current mirror circuit with its input terminal being the connection point between the gate and the drain of the transistor 222 and its output terminal being the drain of the transistor 221, which functions as the load circuit for the differential pair (225, 226). Further, the n-channel transistors 223 and 224 are deactivated by turning off of the switches 541 and 542. Further, the current mirror circuit (221, 222) also functions as the load circuit for the current mirror circuit (211, 212) and the current mirror circuit (213, 214), which mirror the output currents of the n-channel differential pair (215, 216), respectively. Incidentally, the output of the differential circuit becomes the voltage Vdf2 from the terminal 4 connected to the common drain terminal of the transistors 223 and 226.

The equivalent circuit in the first connection changeover in FIG. 4 is the same as a configuration obtained by replacing the p-channel transistor 212 with the p-channel transistor 214 in FIG. 3A. The equivalent circuit in the second connection changeover in FIG. 4 is the same as a configuration obtained by replacing the n-channel transistor 223 with the n-channel transistor 221 in FIG. 3B.

If the respective switches in FIG. 4 are composed by transistors, pass-transistor switches each composed by the single transistor can be employed for the switches 531, 532, 541, 542, 533, and 543, as in FIG. 1. The potentials of the both ends of the switches 534 and 544 while turned on, however, change according to the operation of the differential circuit. Thus, they need to be constituted by a switch configuration in which a p-channel transistor switch and an n-channel transistor switch are provided in parallel.

Incidentally, for changeover of the polarity symmetry of the differential circuit by the connection changeover means, any combination is possible if the p-channel transistors (211, 212, 213, and 214) are switched to one current circuit and the n-channel transistors (221, 222, 223, and 224) are switched to two current mirror circuits, or if the p-channel transistors are switched to two current mirror circuits and the n-channel transistors are switched to one current mirror circuit. Though FIGS. 1 and 4 show examples of two typical changeover methods, other methods can also be employed.

Next, other embodiment of the present invention will be described. FIG. 6 shows a configuration according to a third embodiment of the present invention. FIG. 6 shows the configuration of an amplifier circuit configured by using the differential circuit in FIG. 1. That is, a differential circuit in FIG. 6 including the n-channel differential pair (215, 216), p-channel differential pair (225, 226), p-channel transistors (211, 212, 213, 214), n-channel transistors (221, 222, 223, 224), constant-current sources 217 and 227, and connection changeover means (the switches 511 to 514, 521 to 524) is the same as the differential circuit shown in FIG. 1. FIG. 7 is a table showing an example of methods of controlling the amplifier circuit in FIG. 6.

Referring to FIG. 6, this amplifier circuit is a feedback-type amplifier circuit that includes amplification stages 310 and 320 that operate in response to the outputs Vdf1 and Vdf2 of the differential circuit shown in FIG. 1, respectively. Referring to FIG. 6, an input voltage Vin (the input voltage VinP in FIG. 1) and an output voltage Vout (the input voltage VinM in FIG. 1) are input to two input terminals (differential input terminals) of the differential circuit. A driver circuit in FIG. 6 can output a voltage equal to the input terminal voltage Vin from an output terminal 2 as the output voltage (output terminal voltage) Vout.

The amplification stage 310 is a charging amplification stage for charging the output terminal 2 at high speed, while the amplification stage 320 is a discharging amplification stage for discharging the output terminal 2 at high speed. The configurations of the charging amplification stage 310 and the discharging amplification stage 320 will be described below with reference to FIG. 8 and the like. Referring to FIG. 7, an operation of the amplifier circuit in FIG. 6 will be described.

Referring to FIG. 6, in the state of the first connection changeover in the differential circuit, the switches 511, 512, 513, and 514 are turned off, and the switches 521, 522, 523, and 524 are turned on. The amplification stage 310 is activated (to allow operation), while the amplification stage 320 is deactivated (to stop operation).

Then, when the output terminal voltage Vout is lower than the input terminal voltage Vin, the output terminal voltage Vout can be quickly increased to the input terminal voltage Vin through the operation of the differential circuit responsive to a voltage difference between the input terminal voltage Vin and the output terminal voltage Vout and a high-speed charging operation of the amplification stage 310.

On the other hand, in the state of the second connection changeover in the differential circuit, the switches 511, 512, 513, and 514 are turned on, and the switches 521, 522, 523, and 524 are turned off. The amplification stage 310 is deactivated (to stop operation), while the amplification stage 320 is activated (to allow operation).

Then, when the output terminal voltage Vout is higher than the input terminal voltage Vin, the output terminal voltage Vout can be quickly reduced to the input terminal voltage Vin through the operation of the differential circuit responsive to the voltage difference between the input terminal voltage Vin and the output terminal voltage Vout and a high-speed discharging operation of the amplification stage 320. In other words, the output terminal voltage Vout can be made to follow the input terminal voltage Vin at high speed at any time in response to a change in the input terminal voltage Vin if control for the first connection changeover is performed when the Vin is larger than the Vout and control for the second connection changeover is performed when the Vin is smaller than the Vout.

The differential circuit in both states of the first and second connection changeovers operates normally with respect to the input terminal voltage Vin and the output terminal voltage Vout in the power supply voltage range from the low-potential power supply VSS to the high-potential power supply VDD. Thus, in the first connection changeover, the high-speed charging operation on the output terminal 2 over the power supply voltage range is possible, while in the second connection changeover, the high-speed discharging operation on the output terminal 2 over the power supply voltage range is possible.

Incidentally, though a description about FIGS. 6 and 7 was given about a case where the differential circuit shown in FIG. 1 was employed, other differential circuit in FIG. 4 and other configuration described above may also be employed as the differential circuit in FIG. 6.

Other embodiment of the present invention will also be described. FIG. 8 shows a configuration according to a fourth embodiment of the present invention. FIG. 8 shows the configuration of an amplifier circuit configured by using the differential circuit in FIG. 1. That is, referring to FIG. 8, an amplifier circuit 210 composed by the n-channel differential pair (215, 216), p-channel differential pair (225, 226), p-channel transistors (211, 212, 213, and 214), n-channel transistors (221, 222, 223, and 224), constant-current sources 217 and 227, and connection changeover means (the switches 511 to 514, 521 to 524) is the same as the differential circuit shown in FIG. 1.

The amplification stage 310 for charging includes a p-channel transistor 311, a switch 553, and a constant-current source 313. The source of the p-channel transistor 311 is connected to the high-potential power supply VDD, the drain of the p-channel transistor 311 is connected to the output terminal 2, and the gate of the p-channel transistor 311 is connected to the first output terminal 3 (a connection point between the drains of the transistors 212 and 215) of the differential circuit through a switch 551. The switch 553 is connected in series with the constant-current source 313 between the drain of the transistor 311 and the low-potential power supply VSS. A capacitor 312 is feedback-connected between the output terminal 2 (the drain output of the transistor 311) and the gate of the transistor 311, so that waveform shaping of a rising voltage wave for the output terminal 2 is performed. The amplification stage 310 further includes a switch 552 inserted between the high-potential power supply VDD and the gate of the transistor 311, for controlling activation and deactivation of the transistor 311

The amplification stage 320 for discharging includes an n-channel transistor 321, a switch 563, and a constant-current source 323. The source of the n-channel transistor 321 is connected to the low-potential power supply VSS. The drain of the n-channel transistor 321 is connected to the output terminal 2, and the gate of the n-channel transistor 321 is connected to the second output terminal 4 (a connection point between the drain terminals of the transistors 223 and 226) of the differential circuit through a switch 561. The switch 563 is connected in series with the constant-current source 323 between the drain of the transistor 321 and the high-potential power supply VDD. A capacitor 322 is feedback-connected between the output terminal 2 (the drain output of the transistor 321) and the gate of the transistor 321, so that waveform shaping of the falling voltage wave for the output terminal 2 is performed. The amplification stage 320 further includes a switch 562 for controlling activation and deactivation of the transistor 321 inserted between the low-potential power supply VSS and the gate of the transistor 321.

Referring to FIG. 8, this amplifier circuit is a feedback-type amplifier circuit that includes the amplification stages 310 and 320 that operate in response to the outputs Vdf1 and Vdf2 of the differential circuit shown in FIG. 1, respectively. Referring to FIG. 8, the input voltage Vin (input voltage VinP in FIG. 1) and the output voltage Vout (input voltage VinM in FIG. 1) are supplied to the two input terminals (differential input terminals) of the differential circuit. The amplifier circuit in FIG. 8 can output a voltage equal to the input terminal voltage Vin from the output terminal 2 as the output voltage (output terminal voltage) Vout.

The amplification stage 310 in FIG. 8 shows a circuit configuration of the charging amplification stage that can charge the output terminal 2 at high speed, while the amplification stage 320 shows a circuit configuration of the discharging amplification stage that can discharge the output terminal 2 at high speed.

FIG. 9 shows an example of methods of controlling the respective switches in the amplifier circuit in the fourth embodiment in FIG. 8. The respective switches are controlled so that they are in the two connection states, which are the first connection changeover and the second connection changeover. In the first connection changeover, the high-speed charging operation on the output terminal 2 is possible, while in the second connection changeover, the high-speed discharging operation on the output terminal 2 is possible. An operation of the amplifier circuit in FIG. 8 will be described with reference to FIG. 9.

In the first connection changeover in the differential circuit, the switches 511, 512, 513, 514, 561, 563, and 552 are turned off, and the switches 521, 522, 523, 524, 551, 553, and 562 are turned on. At this time, the transistors 211 and 214 are deactivated, and the second output Vdf2 of the differential circuit is deactivated by turning off the switch 561, so that the differential circuit becomes equivalent to the circuit in FIG. 3(A). The amplification stage 320 for discharging is deactivated (to stop operation).

In the first connection changeover, when the input terminal voltage Vin becomes larger than the Vout, the first output signal Vdf1 of the differential circuit is reduced according to the voltage difference between the Vin (VinP in FIG. 1) and the Vout (VinM in FIG. 1), as described about the operation of the differential circuit in FIG. 1. For this reason, the gate of the p-channel transistor 311 is reduced, thereby allowing an increase in the output terminal voltage Vout to the Vin at high speed under high charging power.

When the input terminal voltage Vin is smaller than the Vout, the first output signal Vdf1 of the differential circuit rises to raise the gate of the p-channel transistor 311. Thus, the p-channel transistor 311 is turned off, and the output terminal voltage Vout is thereby reduced to the Vin at a speed in accordance with the discharging power of the constant-current source 313.

On the other hand, in the second connection changeover in the differential circuit, the switches 511, 512, 513, 514, 561, 563, and 552 are turned on, and the switches 521, 522, 523, 524, 551, 553, and 562 are turned off. At this time, the transistors 221 and 224 are deactivated. The first output Vdf1 of the differential circuit is deactivated by turning off of the switch 551. The differential circuit thereby becomes equivalent to the circuit in FIG. 3(B). The amplification stage 310 for charging is deactivated (to stop operation).

In the second connection changeover, when the input terminal voltage Vin becomes smaller than the Vout, the second output signal Vdf2 of the differential circuit increases responsive to the voltage difference between the Vin (VinP in FIG. 1) and the Vout (VinM in FIG. 1), as described about the operation of the differential circuit in FIG. 1. For this reason, the gate of the n-channel transistor 321 is raised, thereby allowing a reduction in the output terminal voltage Vout to the Vin at high speed under high discharging power.

When the input terminal voltage Vin is larger than the Vout, the second output signal Vdf2 of the differential circuit is reduced to reduce the gate of the n-channel transistor 321. The n-channel transistor 321 is thereby turned off, so that the output terminal voltage Vout is increased to the Vin at a speed in accordance with the charging power of the constant-current source 323.

The phase compensating capacitors 312 and 322 respectively produce a waveform shaping operation so that the output terminal voltage Vout changes smoothly when the transistor 311 performs charging and when the transistor 321 performs discharging.

The amplification stage 310 for charging is configured to allow prevention of momentary output noise that is not associated with the input terminal voltage Vin when changeover from the second connection changeover (deactivation) state to the first connection changeover (activation) state is performed. In the second connection changeover (deactivation) state, the amplification stage 310 for charging deactivates the transistor 311 through the switch 552, and charges one end of the phase compensating capacitor 312 connected to the gate of the transistor 311 to the power supply voltage VDD. Accordingly, when changeover from the second connection changeover state to the first connection changeover (activation) state has been performed, even if the output voltage Vdf1 of the differential circuit has undergone a temporary variation that is not associated with the input terminal voltage Vin, the transistor 311 can be prevented from being turned on due to electrical charges at one end of the capacitor 312, charged to the power supply voltage VDD. Then, when sufficient electrical charges have been supplied due to the normal output voltage Vdf1 of the differential circuit caused by the input terminal voltage Vin, the gate of the transistor 311 is controlled. The normal charging operation is thereby started.

Likewise, the amplification stage 320 for discharging is configured to allow prevention of momentary output noise that is not associated with the input terminal voltage Vin when changeover from the first connection (deactivation) state to the second connection (activation) state is performed. In the first connection changeover (deactivation) state, the amplification stage 320 for discharging deactivates the transistor 321 through the switch 562, and discharges one end of the phase compensating capacitor 322 connected to the gate of the transistor 321, to the power supply voltage VSS. Accordingly, when changeover from the first connection changeover state to the second connection changeover (activation) state has been performed, even if the output voltage Vdf2 of the differential circuit has undergone the temporary variation that is not associated with the input terminal voltage Vin, the transistor 321 can be prevented from being turned on due to electrical charges discharged to the power supply voltage VSS at one end of the capacitor 322. Then, when sufficient electrical charges have been supplied due to the normal output voltage Vdf2 of the differential circuit caused by the input terminal voltage Vin, the gate of the transistor 321 is controlled. The normal discharging operation is thereby started.

As described above, by performing control over connection changeover as shown in FIG. 9 according to a change in the input voltage Vin, the amplifier circuit in FIG. 8 can perform charging and discharging operations at high speed in the wide input and output ranges.

In other words, when the Vin is larger than Vout, control is executed so that changeover to the first connection changeover is performed. When the Vin is smaller than the Vout, control is executed so that changeover to the second connection changeover is performed. The output terminal voltage Vout can be thereby made to follow the input terminal voltage Vin at high speed at any time, responsive to a change in the input terminal voltage Vin. Further, since the constant-current sources 313 and 323 do not directly contribute to the driving speed at this time, the currents of them can be limited to a sufficiently small level. The amplifier circuit in FIG. 8 can be thereby driven at high speed with low power consumption.

Next, a fifth embodiment of the present invention will be described. FIG. 10 is a diagram showing a configuration according to the fifth embodiment of the present invention, and is the diagram showing other circuit configuration of the amplifier circuit shown in FIG. 6. In the amplifier circuit in FIG. 10, the amplification stage 310 for charging is obtained by replacing the current source 313 and the switch 553 in the amplification stage 310 in FIG. 8 with a follower-type discharging circuit 410, and the amplification stage 320 for discharging is obtained by replacing the current source 323 and the switch 563 in the amplification stage 320 in FIG. 8 with a follower-type charging circuit 420. The configuration of other components of the amplification stage 310 for charging and the amplification stage 320 for discharging and the differential circuit 210 are the same as the configurations shown in FIG. 8.

Referring to FIG. 10, the differential circuit differentially inputs the voltage of the input terminal 1 or the input terminal voltage Vin and the voltage of the output terminal 2 or the output terminal voltage Vout. A description about the configuration of the differential circuit 210 in FIG. 10 will be omitted.

Referring to FIG. 10, the amplification stage 310 for charging includes the p-channel transistor 311, and the follower-type discharging circuit 410. The source of the p-channel transistor 311 is connected to the high-potential power supply VDD and the drain of the p-channel transistor 311 is connected to the output terminal 2, and the gate of the p-channel transistor 311 is connected to the first output terminal 3 of the differential circuit (the connection point between the drains of the transistors 212 and 215) through the switch 551. The follower-type discharging circuit 410 includes a follower-structured p-channel transistor 412, connected between the output terminal 2 and the low-potential power supply VSS, and a diode-connected p-channel transistor 411. The p-channel transistor 411 is interposed between the input terminal 1 and the low-potential power supply VSS and is driven by a constant-current source 414. The gate of the p-channel transistor 411 is connected to the gate of the follower-structured transistor 412. A capacitor 312 is feedback-connected between the output terminal 2 and the gate of the transistor 311, and waveform shaping of the rising voltage wave for the output terminal 2 is performed. The amplification stage 310 for charging includes the switch 552 inserted between the high-potential power supply VDD and the gate of the transistor 311, for controlling activation and deactivation of the transistor 311.

The follower-type discharging circuit 410 also includes a switch 573 inserted between the transistor 412 and the low-potential power supply VSS, a switch 572 connected in series with the constant-current source 414 between the transistor 411 and the low-potential power supply VSS, a switch 571 and a constant-current source 413 connected in series between the transistor 411 and the high-potential power supply VDD.

The amplification stage 320 for discharging includes the n-channel transistor 321 and[ ]the follower-type charging circuit 420. The source of the n-channel transistor 321 is connected to the low-potential power supply VSS, the drain of the n-channel transistor 321 is connected to the output terminal 2, and the gate of the n-channel transistor 321 is connected to the second output terminal 4 (a connecting point between the drains of the transistors 223 and 226) of the differential circuit through the switch 561. The follower-type charging circuit 420 includes a follower-structured n-channel transistor 422 connected between the output terminal 2 and the high-potential power supply VDD, and a diode-connected n-channel transistor 421 inserted between the high-potential power supply VDD and the input terminal 1. The n-channel transistor 421 is driven by a constant-current source 424, and the gate of the n-channel transistor 421 is connected to the gate of the follower-structured transistor 422. The capacitor 322 is feedback-connected between the output terminal 2 and the gate of the transistor 321, so that waveform shaping of the falling voltage waveform for the output terminal 2 is performed. The amplification stage 320 for discharging also includes the switch 562 inserted between the low-potential power supply VSS and the gate of the transistor 321, for controlling activation and deactivation of the transistor 321.

The follower-type charging circuit 420 includes a switch 583 inserted between the transistor 422 and the high-potential power supply VDD, a switch 582 connected in series with constant-current source 424 between the transistor 421 and the high-potential power supply VDD, a switch 581 and a constant-current source 423 connected in series between the transistor 421 and the low-potential power supply VSS. Referring to FIG. 10, the configurations of components other than the differential circuit, or details of the transistor 311 that constitutes a feedback-type charging circuit with the differential circuit, transistor 321 that constitutes a feedback-type discharging circuit with the differential circuit, follower-type discharging circuit 410, and follower-type charging circuit 420 will be described in literature (Priority Patent Application No. 2001-373302 based on JP Patent Application No. 2000-402079, not laid open as of the filing time of the present application).

Like the amplifier circuit in FIG. 8, the amplifier circuit in FIG. 10 is also the feedback-type amplifier circuit which includes the amplification stages 310 and 320 that operate in response to the outputs Vdf1 and Vdf2 of the differential circuit, respectively. Referring to FIG. 10, the input voltage Vin and the output voltage Vout are supplied to two input terminals of the differential circuit. The amplifier circuit in FIG. 10 can output a voltage equal to the input voltage Vin from the output terminal 2 as the output voltage (output terminal voltage) Vout.

Operations of the follower-type discharging circuit 410 and the follow-type charging circuit 420 will be described briefly. Transistor characteristics of the p-channel transistors 411 and 412 of the follower-type discharging circuit 410 are assumed to be equal to each other, and currents controlled by the current sources 413 and 414 are also assumed to be equal. The transistor characteristics of the n-channel transistors 421 and 422 of the follower-type charging circuit 420 are assumed to be equal to each other, and currents controlled by the current sources 423 and 424 are also assumed to be equal. Further, the state where the output terminal voltage Vout is equal to the input terminal voltage Vin is assumed to be the reference state.

In the reference state where the Vout is equal to the Vin and the follower-type discharging circuit 410 can operate, the p-channel transistors 411 and 412 are in the on-state, and the gate voltages of the respective transistors become the voltages different from the input terminal voltage Vin by their gate-source voltages. At this time, the gate-source voltages of the p-channel transistors 411 and 412 are equal, and the drain currents of the p-channel transistors 411 and 412 are also equal.

When a change in the reference state has occurred and then the Vin becomes smaller than the Vout, the gate-source voltage of the p-channel transistor 412 increases. Thus, through the discharging operation of the p-channel transistor 412 due to a source-follower operation, the output terminal voltage Vout is reduced to a level where the Vout is equal to the Vin. On the other hand, when a change in the reference state has occurred and then the Vin becomes larger than the Vout, the gate-source voltage of the p-channel transistor 412 becomes smaller than the level where the Vout is equal to the Vin. The discharging operation thereby becomes weak.

In this manner, the follower-type discharging circuit 410 has an effect of developing a strong discharging operation when the Vout is larger the Vin, reducing the discharging power as the Vout becomes closer to the Vin, and stabilizing the output terminal voltage Vout at the input terminal voltage Vin. Further, even if the currents controlled by the current sources 413 and 414 have been limited to a sufficiently low level, the source-follower discharging operation of the p-channel transistor 412 responsive to the gate-source voltage does not change. Thus, the follower-type discharging circuit 410 can operate with low power consumption.

On the other hand, in the reference state where the Vout is equal to the Vin and the follower-type charging circuit 420 can operate, the n-channel transistors 421 and 422 are in the on-state, and the gate voltages of the transistors become the voltages different from the input voltage Vin by their gate-source voltages. At this time, the gate-source voltages of the n-channel transistors 421 and 422 are equal, and the drain currents of the p-channel transistors 421 and 422 are also equal.

When a change in the reference state has occurred and then the Vin becomes larger than the Vout, the gate-source voltage of the n-channel transistor 422 increases. Thus, through the charging operation of the n-channel transistor 422 due to the source-follower operation, the output terminal voltage Vout is increased to the level where the Vout is equal to the Vin. On the other hand, when a change in the reference state has occurred and then the Vin becomes smaller than the Vout, the gate-source voltage of the n-channel transistor 422 becomes smaller than the level where the Vout is equal to the Vin. The charging operation thereby becomes weak.

In this manner, the follower-type charging circuit 420 has an effect of developing a strong charging operation when the Vout is smaller than the Vin, reducing the charging power as the Vout becomes closer to the Vin, and stabilizing the output terminal voltage Vout at the input terminal voltage Vin. Further, even if the currents controlled by the current sources 423 and 424 have been limited to a sufficiently low level, the source-follower charging operation of the n-channel transistor 422 responsive to the gate-source voltage does not change. Thus, the follower-type charging circuit 420 can operate with low power consumption.

FIG. 11 shows an example of methods of controlling the respective switches in the amplifier circuit shown in FIG. 10. The respective switches are controlled so that they are in the two states, which are the first connection changeover and the second connection changeover. In the first connection changeover, the charging operation on the output terminal 2 at high speed is possible, while in the second connection changeover, the discharging operation on the output terminal 2 at high speed is possible. An operation of the amplifier circuit in FIG. 10 will be described with reference to FIG. 11.

In the first connection changeover in the differential circuit, the switches 511, 512, 513, 514, 561, 552, 581, 582, and 583 are turned off, and the switches 521, 522, 523, 524, 551, 562, 571, 572, and 573 are turned on. At this time, the transistors 211 and 214 in the differential circuit 210 are deactivated, and the second output Vdf2 of the differential circuit is deactivated by turning off of the switch 561, so that the differential circuit becomes equivalent to the circuit in FIG. 3(A). The amplification stage 320 for discharging is deactivated (to stop operation).

In the first connection changeover, when the input terminal voltage Vin becomes larger than the Vout, the first output signal Vdf1 of the differential circuit is reduced according to the voltage difference between the Vin (VinP in FIG. 1) and the Vout (VinM in FIG. 1), as described about the operation of the differential circuit in FIG. 1. For this reason, the gate of the p-channel transistor 311 is reduced, thereby allowing an increase in the output terminal voltage Vout to the Vin at high speed under high charging power.

When the input terminal voltage Vin becomes smaller than the Vout, the first output signal Vdf1 of the differential circuit rises to raise the gate of the p-channel transistor 311. Thus, the p-channel transistor 311 is turned off, and through the discharging operation of the follower-type discharging circuit 410, the output terminal voltage Vout is reduced to the input terminal voltage Vin.

Incidentally, in the stable state (reference state) where the Vin is equal to the Vout, the drain current of the p-channel transistor 412 becomes stable, balancing the drain current of the p-channel transistor 311.

The follower-type discharging circuit 410 performs the source-follower discharging operation. Thus, the larger the voltage difference between the input terminal voltage Vin and the output terminal voltage Vout is, the higher its discharging power is, and its discharging power decreases as the output terminal voltage Vout becomes closer to the input terminal voltage Vin.

Further, the source-follower discharging operation of the follower-type discharging circuit 410 is performed momentarily without a delay, responsive to the voltage difference between the Vin and the Vout. For this reason, even if the high-speed charging operation of the p-channel transistor 311 has produced an overshoot due to a response delay of its feedback configuration, the follower-type discharging circuit 410 has an effect of quickly suppressing the overshoot and stabilizing the output terminal voltage Vout at the Vin. For this reason, the amplifier circuit in this embodiment can perform more stable driving operation at higher speed than the amplifier circuit in FIG. 8 that uses the constant-current source 313 having constant discharging power.

Accordingly, the amplifier circuit shown in FIG. 10 can also realize output stabilization without requiring a phase compensating capacitor for the output stabilization, or just by providing a capacitor of a sufficiently small phase compensating capacity.

On the other hand, in the second connection changeover in the differential circuit, the switches 511, 512, 513, 514, 561, 552, 581, 582, and 583 are turned on, and the switches 521, 522, 523, 524, 551, 562, 571, 572, and 573 are turned off. At this time, the transistors 221 and 224 of the differential circuit 210 are deactivated. The first output Vdf1 of the differential circuit is deactivated by turning off of the switch 551. The differential circuit thereby becomes equivalent to the circuit in FIG. 3(B). The amplification stage 310 for charging is deactivated (to stop operation).

In the second connection changeover, when the input terminal voltage Vin becomes smaller than the Vout, the second output signal Vdf2 of the differential circuit increases responsive to the voltage difference between the Vin (VinP in FIG. 1) and the Vout (VinM in FIG. 1), as described about the operation of the differential circuit in FIG. 1. For this reason, the gate of the n-channel transistor 321 is raised, thereby allowing an increase in the output terminal voltage Vout to the Vin at high speed under high discharging power.

On the other hand, when the input terminal voltage Vin is larger than the Vout, the second output signal Vdf2 of the differential circuit is reduced to reduce the gate of the n-channel transistor 321. The n-channel transistor 321 is thereby turned off, so that the output terminal voltage Vout is raised to the input terminal voltage Vin through the charging operation of the follower-type charging circuit 420. Incidentally, in the stable state (reference state) where the Vin is equal to the Vout, the drain current of the n-channel transistor 422 becomes stable, balancing the drain current of the n-channel transistor 321.

The follower-type charging circuit 420 performs the source-follower charging operation. Thus, the larger the voltage difference between the Vin and the Vout is, the higher its charging power is, and its charging power decreases as the Vout becomes closer to the Vin.

Further, the source-follower charging operation of the follower-type charging circuit 420 is performed momentarily without a delay, responsive to the voltage difference between the Vin and the Vout. For this reason, even if the high-speed discharging operation of the n-channel transistor 321 has produced an overshoot due to a response delay of its feedback configuration, the follower-type charging circuit 420 has an effect of quickly suppressing the overshoot and stabilizing the output terminal voltage Vout at the input terminal voltage Vin. For this reason, the amplifier circuit in this embodiment can perform more stable driving operation at higher speed than the amplifier circuit in FIG. 8 that uses the constant-current source 323 having constant charging power.

Accordingly, the amplifier circuit shown in FIG. 10 can also realize the output stabilization without requiring the phase compensating capacitor for the output stabilization or just by providing the capacitor of the sufficiently small phase compensating capacity.

Elimination of the need for the phase compensating capacitor for the output stabilization in a voltage-follower configuration in this manner is one of main characteristics of the present invention. The capacitor having the sufficiently small phase compensating capacity is exclusively employed for waveform shaping. Further, by allowing a reduction in the phase compensating capacity, the amount of current required for charging and discharging the phase compensating capacitor can be reduced, so that current consumption for the differential circuit can be reduced.

Further, in a configuration that uses the phase compensating capacitor, the amplification stage 310 for charging is configured to allow prevention of momentary output noise that is not associated with the input terminal voltage Vin when changeover from the second connection (deactivation) state to the first connection (activation) state is performed. Likewise, the amplification stage 320 for discharging is also configured to allow prevention of momentary output noise that is not associated with the input terminal voltage Vin when changeover from the first connection (deactivation) state to the second connection (activation) state is performed.

As described above, by performing control over connection changeover as shown in FIG. 11 according to a change in the input voltage Vin, the amplifier circuit in FIG. 10 can perform high-speed charging and discharging operations in the wide input and output ranges. In other words, if control is performed so that changeover to the first connection changeover is performed when the Vin is larger than Vout, and control is performed so that changeover to the second connection changeover is performed when the Vin is smaller than the Vout, the output terminal voltage Vout can be made to follow the input terminal voltage Vin at any time at high speed responsive to a change in the input terminal voltage Vin. Further, the currents of the constant-current sources 413 and 414 of the follower-type discharging means 410 and the currents of the constant-current sources 423 and 424 of the follower-type charging means 420 can be limited to sufficiently small levels, so that the power consumption of both of the source-follower discharging means 410 and the source-follower charging means 420 is small. Accordingly, the amplifier circuit in FIG. 10 can perform high-speed driving with low power consumption.

By adding the follower-type discharging means 410 and the follower-type charging means 420 to the amplifier circuit in FIG. 10, output stability can be enhanced using the phase compensating capacitor having a lower capacity than the phase compensating capacitor in the amplifier circuit in FIG. 8. By reducing the capacity of the phase compensating capacitor, the transistors 311 and 321 in the amplification stages can be quickly controlled even if the current that flows through the differential circuit is small. Thus, the amplifier circuit in FIG. 10 can perform higher-speed driving than the amplifier circuit in FIG. 8, or the current of the differential circuit can be limited more than in the amplifier circuit in FIG. 8.

FIG. 12 is a diagram showing a variation of the amplifier circuit shown in FIG. 10. Details of configurations other than the differential circuit 210 in FIG. 12 are described in the literature (Priority Patent Application No. 2001-373302 based on JP Patent Application No. 2000-402079). Referring to FIG. 12, the number of devices in FIG. 12 is less than in the configuration in FIG. 10, the follower-type discharging means 410 in FIG. 10 was replaced with a circuit 430, and the follower-type charging means 420 in FIG. 10 was replaced with a circuit 440. Other configurations are the same as those in FIG. 10.

Referring to FIG. 12, like reference characters are assigned to devices that perform same operations as the devices shown in FIG. 10. In FIG. 12, a transistor 419 with its drain and the source connected to the drain and the source of the transistor 411, respectively and a transistor 429 with its source and the drain connected to the source and the drain of the transistor 421, respectively are added. Predetermined bias voltages VB1 and VB2 are applied to the gates of the transistors 419 and 429, respectively.

FIG. 13 shows an example of methods of controlling the respective switches in the amplifier circuit shown in FIG. 12. The respective switches are controlled so that they are in the two states, which are the first connection changeover and the second connection changeover. In the first connection changeover, the high-speed charging operation on the output terminal 2 is possible, while in the second connection changeover, the high-speed discharging operation on the output terminal 2 is possible. An operation of the amplifier circuit in FIG. 12 will be described with reference to FIG. 13.

In the first connection changeover in the amplifier circuit, the switches 511, 512, 513, 514, 561, 552, and 583 are turned off, and the switches 521, 522, 523, 524, 551, 562, and 573 are turned on. At this time, the differential circuit becomes equivalent to the circuit in FIG. 3(A), so that the p-channel transistor 311 and the circuit 430 are activated (operated). Further, the bias voltage VB1 performs controls so that the transistor 419 is turned off, while the bias voltage VB2 controls the transistor 429 so that the current controlled by the current source 424 flows between the high-potential power supply VDD and the input terminal 1, even if the transistor 421 is turned off. With this arrangement, the circuit 430 becomes equivalent to the follower-type discharging means 410 in FIG. 10

On the other hand, in the second connection changeover in the amplifier circuit, the switches 511, 512, 513, 514, 561, 552, and 583 are turned on, and the switches 521, 522, 523, 524, 551, 562, and 573 are turned off. At this time, the differential circuit becomes equivalent to the circuit in FIG. 3(B). The n-channel transistor 321 and the circuit 440 are activated (operated). The bias voltage VB2 performs control so that the transistor 429 is turned off, while the bias voltage VB1 controls the transistor 419 so that the current controlled by the current source 414 flows between the low-potential power supply VSS and the input terminal 1, even if the transistor 411 is turned off. With this arrangement, the circuit 440 becomes equivalent to the follower-type charging means 420 in FIG. 10. Accordingly, the amplifier circuit in FIG. 12 has the same performance as the amplifier circuit in FIG. 10.

Next, a sixth embodiment of the present invention will be described. FIG. 14 is a diagram for explaining the sixth embodiment of the present invention, and is the diagram showing an example where the amplifier circuit according to the present invention has been applied to a multi-output driver circuit. This embodiment can be used as a driver circuit for an active-matrix type display device. The amplifier circuit according to each of the embodiments described with reference to FIG. 6, 8, 10, or 12 can be employed as an output circuit 100. A control signal controls the switches of the amplifier circuit according to the present invention, which constitutes the output circuit 100. Analog gray-scale level voltages are outputted from taps for resistive voltage division provided between reference voltages VH and VL, and the driver circuit comprises decoders 300, output terminals 400, and output stages 100. Among gray-scale voltages generated from respective terminals (taps) of a resistor string 200, a gray-scale voltage is selected by a decoder 300 according to a digital video signal for each output. Then, the selected gray-scale voltage is amplified by the output circuit 100 for driving a data line connected to an output terminal 400. By performing control of changeover between the first connection changeover and the second connection changeover depending on charging and discharging of the data line in the output circuit 100, high-speed driving can be realized with low power consumption.

Figure 15:
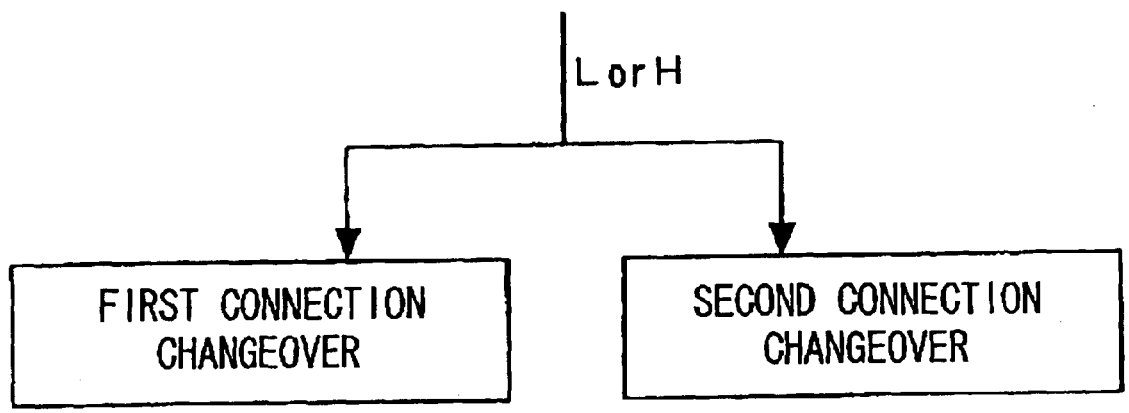
FIG. 15 is a diagram showing a configuration of a seventh embodiment of the present invention.
Figure 16:
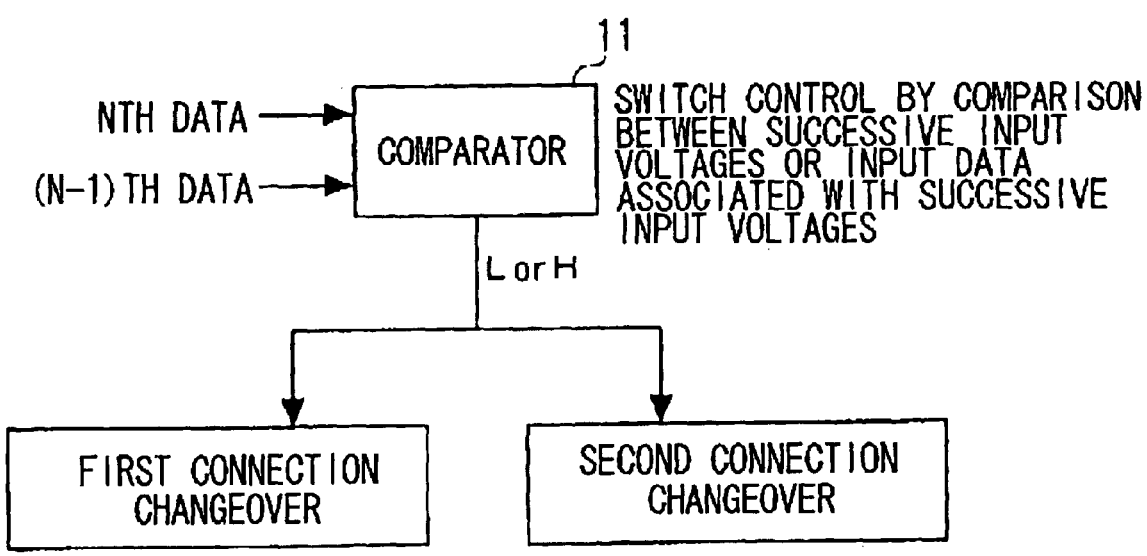
FIG. 16 is a diagram showing a configuration of an eighth embodiment of the present invention.
Figure 17:
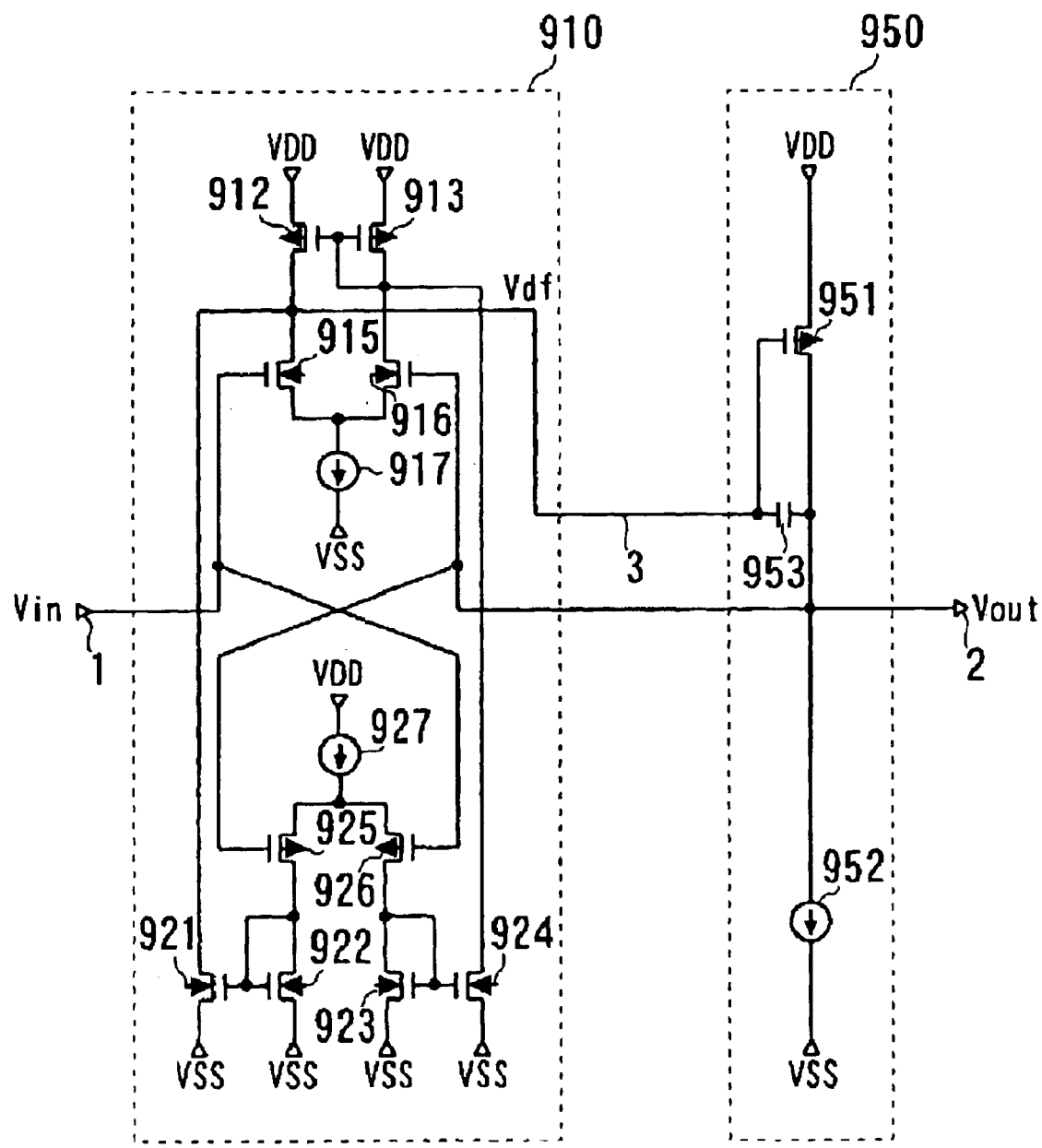
FIG. 17 is a diagram showing a configuration of a first conventional amplifier circuit.
Figure 18:
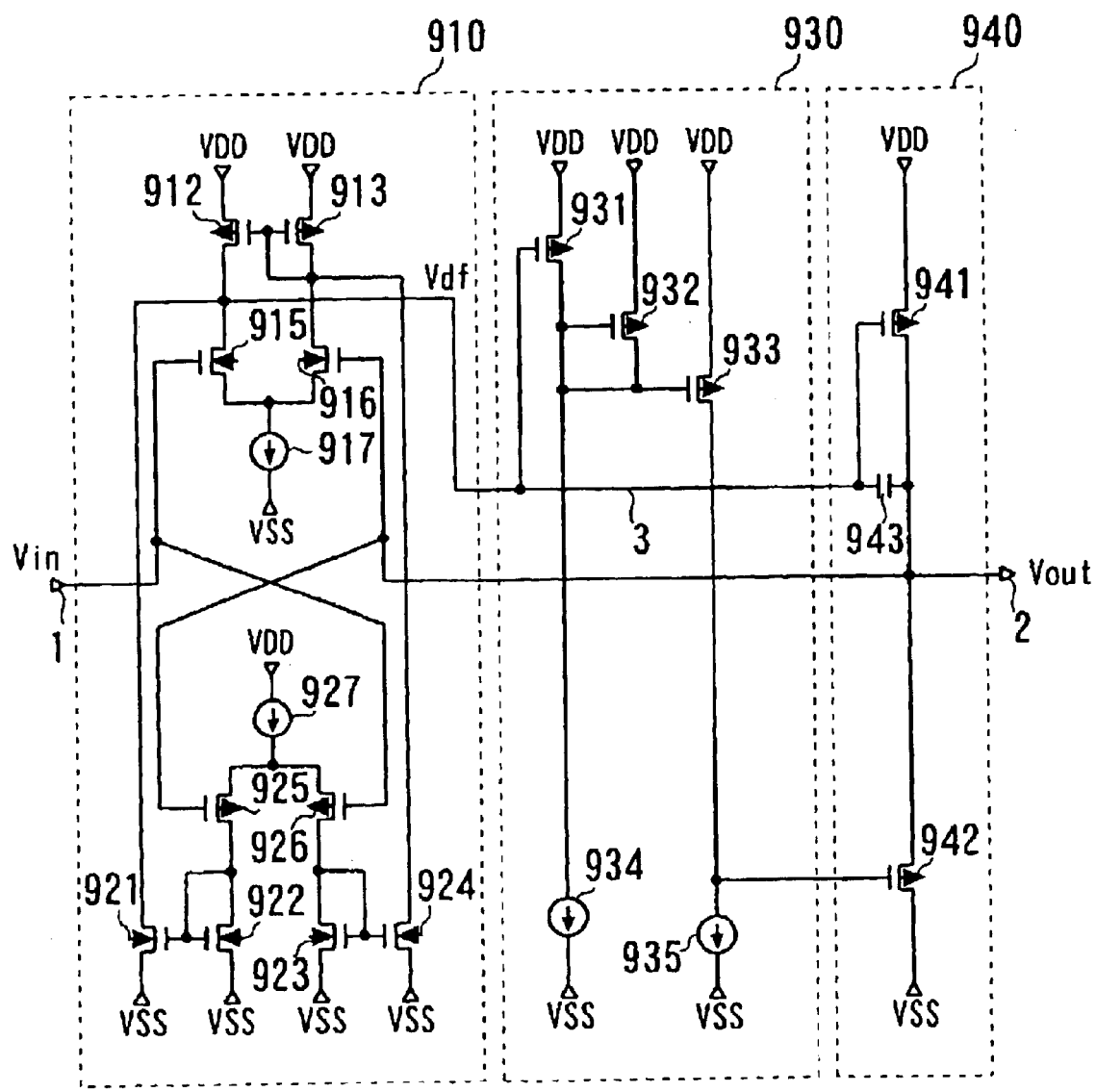
FIG. 18 is a diagram showing a configuration of a second conventional amplifier circuit.

FIGS. 15 and 16 are diagrams for explaining seventh and eighth embodiments of the present invention. Both of FIGS. 15 and 16 are diagrams showing embodiments of the control of the changeover between the first and second connection changeovers in the respective amplifier circuits in FIGS. 6, 8, 10, and 12. More specifically, if each of the amplifier circuits is employed for the driver circuit for the active-matrix type display device in FIG. 14, application of FIG. 15 or 16 is ideal. The control of the changeover between the first and second connection changeovers in FIGS. 15 and 16 will be described below.

FIG. 15 shows the control of the changeover between the first and second connection changeovers according to a high (H) or low (L) level output of a charging and discharging control signal responsive to charging and discharging an output terminal.

The control of the changeover between the first and second connection changeovers is performed by turning on and off of switches associated with their respective connection states. Thus, in a switch composed by a transistor, the charging and discharging control signal or its inverted signal is supplied to the gate of a switch transistor (of an analog switch or a CMOS transfer gate). Such changeover control is ideal for the dot-inversion-driving method of a liquid crystal display device where charging and discharging operations are regularly performed.

In a data line driver circuit for the dot-inversion-driving method of the liquid crystal display device, positive and negative gray-scale voltages are outputted alternately for a given common voltage. Thus, the data line driver circuit performs the charging operation when the positive gray-scale voltage (with positive polarity) is outputted, and performs the discharging operation when the negative gray-scale voltage (with negative polarity) is outputted.

Accordingly, polarity inversion is associated with the charging operation and the discharging operation. A polarity reversion signal (H, L) is employed as the charging and discharging control signal in FIG. 15, and then control is performed so that for the positive polarity, the first connection changeover is performed and for the negative polarity, changeover to the second connection changeover is performed. High-speed driving with low power consumption can be thereby realized.

Incidentally, the dot-inversion-driving method is well known as a common method of driving the liquid crystal display device. Thus, its detailed description will be omitted.

FIG. 16, on the other hand, shows ideal changeover control for a driver circuit for a display device where charging and discharging operations are irregularly performed. This changeover control is ideal for the common-inversion-driving method of the liquid crystal display device. Incidentally, the common-inversion-driving method is also known as a common method of driving the liquid crystal display device. Thus, its detailed description will be omitted.

Referring to FIG. 16, (N−1)th data and Nth data responsive to output voltages are input to a comparator 11, where both of the data is compared. Then, according to magnitude, a signal at a high (H) level or a low (L) level is outputted. Then, according to the output of the comparator 11, control of the changeover between the first and second connection changeovers is performed. Incidentally, the changeover control is performed by turning on and off of switches associated with their respective connection states. Thus, in the case of the switch composed by the transistor, an output signal of the comparator 11 is supplied to the gate of the switch transistor. With this arrangement, even if the charging and discharging operations are irregularly performed, the changeover control of the first and second connection changeovers can be performed optimally. The data supplied to the comparator 11 may be in the form of a digital signal or an analog signal. In the case of the digital signal, the digital video signal in FIG. 14 can be employed. In the case of the analog signal, the output voltage of a decoder 300 in FIG. 14 can be employed. Further, a latch circuit or the like for temporarily storing the (N−1)th data may be provided, as necessary.

The differential circuits and the amplifier circuits (driver circuits) described in the above-mentioned embodiments are composed by MOS transistors. The driver circuit for the liquid crystal device may also be composed by MOS transistors (TFTs) formed of polycrystalline silicon, for example. Bipolar transistors can also be employed for the differential circuits described in the above-mentioned embodiments. In this case, p-channel transistors 211 to 214, 225 and 226 on a high-potential power supply side are composed by pnp transistors, while n-channel transistors 221 to 224, 215 and 216 on a low-potential power supply side are composed by npn transistors.

Foregoing descriptions about the present invention were given in conjunction with the above-mentioned embodiments. The present invention, however, is not limited to the above-mentioned embodiments alone, and naturally includes various variations and modifications which could be made by a person skilled in the art within the scope of the claims of the present invention.

The meritorious effects of the present invention are summarized as follows.

As described above, according to the present invention, by allowing changeover of polarity symmetry in a differential circuit with wide input and output ranges, an amplifier circuit that has used the differential circuit can perform high-speed driving with low power consumption.

Further, by employing the amplifier circuit for a data line driver circuit for a display device, low power consumption for the display device can be achieved.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential circuit comprising:
   a first differential pair, conductivity thereof being a first type, having a differential input pair for receiving first and second input voltages,
   a first constant-current source for driving said first differential pair;
   a second differential pair, conductivity thereof being a second type, having a differential input pair for receiving said first and second input voltages,
       a second constant-current source for driving said second differential pair;
   a first load circuit, including a plurality of transistors of second-type conductivity, connected to a first power supply, for functioning as an active load of said first differential pair;
   a second load circuit, including a plurality of transistors of first-type conductivity, connected to a second power supply, for functioning as an active load of said second differential pair;
   connection means for establishing connection between said first load circuit and said second load circuit, for allowing a passage of a current from at least one of said first load circuit and said second load circuit to the other of said first load circuit and said second load circuit;
   a first output outputted from said first load circuit;
   a second output outputted from said second load circuit; and
   changeover means for changing over between a first connection state for activating the first output and deactivating the second output and a second connection state for activating the second output and deactivating the first output.

2. A differential circuit comprising:
   a first differential pair, comprising first and second transistors of first-type conductivity, for differentially receiving first and second input voltages;
   a first constant-current source for driving said first differential pair;
   a second differential pair comprising third and fourth transistors of second-type conductivity, for differentially receiving the first and second input voltages;
   a second constant-current source for driving said second differential pair;
   at least four transistors of second-type conductivity, connected to a first power supply, for selectively composing at least one current mirror circuit of second-type conductivity, said current mirror circuit functioning as an active load of said first differential pair;
   at least four transistors of first-type conductivity, connected to a second power supply, for selectively composing at least one current mirror circuit of first-type conductivity, said current mirror circuit functioning as the active load of said second differential pair; and
   changeover means for changing over connection of said circuit comprising said first and second differential pairs and said transistors of first-type conductivity and second-type conductivity between a first connection state and a second connection state;

wherein in said first connection state changed over by said changeover means, two of said transistors of second-type conductivity compose one current mirror circuit of second-type conductivity;

input and output terminals of said one current mirror circuit of second-type conductivity are connected to outputs of said first differential pair, respectively;

four of said transistors of first-type conductivity compose two current mirror circuits of first-type conductivity;

input terminals of said two current mirror circuits of first-type conductivity are connected to outputs of said second differential pair, respectively;

output terminals of said two current mirror circuits of first-type conductivity are connected to said input and output terminals of said one current mirror circuit of second-type conductivity, respectively;

said output terminal of said one current mirror circuit of second-type conductivity constitutes a first output terminal; and wherein in said second connection state changed over by said changeover means, two of said transistors of first-type conductivity compose one current circuit of first-type conductivity;

input and output terminals of said one current mirror circuit of first-type conductivity are connected to the outputs of said second differential pair, respectively;

four of said transistors of second-type conductivity compose two current mirror circuits of second-type conductivity;

input terminals of said two current mirror circuits of second-type conductivity are connected to the outputs of said first differential pair, respectively;

output terminals of said two current mirror circuits of second-type conductivity are connected to said input and output terminals of said one current mirror circuit of first-type conductivity, respectively; and said output terminal of said one current mirror circuit of first-type conductivity constitutes a second output terminal.

3. The differential circuit according to claim 2, wherein said transistors of second-type conductivity, comprises:

fifth and sixth transistors connected between the outputs of said first differential pair and said first power supply, respectively, said sixth transistor being diode-connected; and seventh and eighth transistors connected to said first power supply through a first switch and a second switch, respectively, control terminals of said seventh transistor and said eighth transistor being connected to control terminals of said fifth transistor and said sixth transistor, respectively;

wherein said transistors of first-type conductivity are comprised of:

ninth and tenth transistors connected between the outputs of said second differential pair and said second power supply, respectively, said ninth transistor being diode-connected; and eleventh and twelfth transistors connected to said second power supply through a third switch and a fourth switch, respectively, control terminals of said eleventh transistor and said twelfth transistor being connected to control terminals of said ninth transistor and said tenth transistor, respectively;

wherein said differential circuit further comprises:

a fifth switch inserted between said control terminal of said fifth transistor and an output of said fifth transistor, for diode-connecting said fifth transistor when turned on;

a sixth switch inserted between an output of said diode-connected sixth transistor and a connection point between said control terminals of said fifth transistor and said seventh transistor;

a seventh switch inserted between an output of said diode-connected ninth transistor and a connection point between said control terminals of said tenth transistor and said twelfth transistor; and an eighth switch inserted between said control terminal of said tenth transistor and an output of said tenth transistor, for diode-connecting said tenth transistor when turned on; and wherein the output of said fifth transistor is connected to an output of said eleventh transistor;

the output of said sixth transistor is connected to an output of said twelfth transistor;

an output of said seventh transistor is connected to the output of said ninth transistor;

an output of said eighth transistor is connected to the output of said tenth transistor;

a connection point between the output of said fifth transistor and the output of said eleventh transistor is connected to said first output terminal;

a connection point between the output of said eighth transistor and the output of said tenth transistor is connected to said second output terminal; and said first through eighth switches compose said changeover means.

4. The differential circuit according to claim 3, wherein in said first connection state, said first, second, fifth, and seventh switches are turned off, and said third, fourth, sixth, and eighth switches are turned on; and in said second connection state, said first, second, fifth, and seventh switches are turned on, and said third, fourth, sixth, and eighth switches are turned off.

5. The differential circuit according to claim 2, wherein said transistors of second-type conductivity comprise:

a fifth transistor connected to an output of said first transistor of said first differential pair and connected to said first power supply through a first switch, said fifth transistor being diode-connected;

a sixth transistor connected between an output of said second transistor of said first differential pair and said first power supply, said sixth transistor being diode-connected;

a seventh transistor connected to said first power supply through a second switch, a control terminal of said seventh transistor being connected to a control terminal of said fifth transistor; and an eighth transistor connected to said first power supply, a control terminal of said eighth transistor being connected to a control terminal of said sixth transistor; wherein said transistors of first-type conductivity comprise:

a ninth transistor connected between an output of said third transistor of said second differential pair and said second power supply, said ninth transistor being diode-connected;

a tenth transistor connected to an output of said fourth transistor of said second differential pair and connected to said second power supply through a third switch, said tenth transistor being diode-connected;

an eleventh transistor connected to said second power supply, a control terminal of said eleventh transistor being connected to a control terminal of said ninth transistor; and a twelfth transistor connected to said second power supply through a fourth switch, a control terminal of said twelfth transistor being connected to a control terminal of said tenth transistor; wherein said differential circuit further comprises:

a fifth switch inserted between an output of said fifth transistor and an output of said eighth transistor;

a sixth switch inserted between the output of said fifth transistor and an output of said eleventh transistor;

a seventh switch inserted between an output of said tenth transistor and the output of said eleventh transistor; and an eighth switch inserted between the output of said eighth transistor and the output of said tenth transistor; and wherein an output of said seventh transistor is connected to an output of said diode-connected ninth transistor;

an output of said diode-connected sixth transistor is connected to an output of said twelfth transistor;

the output of said first transistor and the output of said fourth transistor are connected to said first output terminal and said second output terminal, respectively; and said first through eighth switches compose said changeover means.

6. The differential circuit according to claim 5, wherein in said first connection state, said first, second, seventh, and eighth switches are turned off, and said third, fourth, fifth, and sixth switches are turned on; and in said second connection state, said first, second, seventh and eighth switches are turned on, and said third, fourth, fifth, and sixth switches are turned off.

7. An amplifier circuit comprising:

an input terminal and an output terminal;

the differential circuit as defined in claim 2;

a charging amplification stage for charging said output terminal in response to one output signal from two outputs of said first and second output terminals of said differential circuit; and a discharging amplification stage for discharging said output terminal in response to the other output signal from the two outputs of said differential circuit;

wherein said differential circuit differentially receives, as the first and second input voltages, a signal voltage of said input terminal and a signal voltage of said output terminal fed back.

8. An amplifier circuit comprising:

an input terminal and an output terminal;

the differential circuit as defined in claim 2;

a charging circuit for charging said output terminal in response to one output signal of two outputs of said first and second output terminals of said differential circuit;

a follower-type discharging circuit including:

a follower-structured first transistor and a switch, connected in series between said output terminal and said second power supply; and first bias control means for supplying an input bias voltage to said follower-structured first transistor based on a voltage of said input terminal, a discharging circuit for discharging said output terminal in response to the other output signal from the two outputs of said differential circuit; and a follower-type charging circuit including:

a follower-structured second transistor and a switch connected in series between said output terminal and said first power supply; and second bias control means for supplying an input bias voltage to said follower-structured second transistor based on the input terminal voltage;

said follower-type charging circuit charging said output terminal by a follower operation of said follower-structured second transistor according to a voltage difference between the input terminal voltage and a voltage of said output terminal;

said follower-type discharging circuit discharging said output terminal by the follower operation of said follower-structured first transistor according to the voltage difference between the input terminal voltage and the output terminal voltage;

wherein said differential circuit receives differentially as the first and second input voltages, a signal voltage of said input terminal and a signal voltage of said output terminal fed back.

9. The amplifier circuit according to claim 7, wherein said charging amplification stage comprises:

a thirteenth transistor of second-type conductivity connected between said first power supply and said output terminal;

a ninth switch connected between a control terminal of said thirteenth transistor and said first output terminal of said differential circuit;

a tenth switch connected between said first power supply and said control terminal of said thirteenth transistor;

a third constant-current source and an eleventh switch, connected in series between said output terminal and said second power supply; and a first capacitor connected between said output terminal and said control terminal of said thirteenth transistor; and wherein said discharging amplification stage comprises:

a fourteenth transistor of first-type conductivity connected between said output terminal and said second power supply;

a twelfth switch connected between a control terminal of said fourteenth transistor and said second output terminal of said differential circuit;

a thirteenth switch connected between said control terminal of said fourteenth transistor and said second power supply;

a fourth constant-current source and a fourteenth switch, connected in series between said output terminal and said first power supply; and a second capacitor connected between said output terminal and said control terminal of said fourteenth transistor.

10. The amplifier circuit according to claim 7, wherein said charging amplification stage comprises:
- a thirteenth transistor of second-type conductivity connected between said first power supply and said output terminal;
- a ninth switch connected between a control terminal of said thirteenth transistor and said first output terminal of said differential circuit;
- a tenth switch connected between said first power supply and said control terminal of said thirteenth transistor;
- a first capacitor connected between said output terminal and said control terminal of said thirteenth transistor; and
- a follower discharging circuit including:
- a follower-structured fifteenth transistor of second-type conductivity and a thirteenth switch, connected in series between said output terminal and said second power supply; and
- first bias control means for supplying a bias voltage to said fifteenth transistor based on the signal voltage of said input terminal; and wherein
said discharging amplification stage comprises:
- a fourteenth transistor of first-type conductivity connected between said output terminal and said second power supply;
- an eleventh switch connected between a control terminal of said fourteenth transistor and said second output terminal of said differential circuit;
- a twelfth switch connected between said control terminal of said fourteenth transistor and said second power supply;
- a second capacitor connected between said output terminal and said control terminal of said fourteenth transistor; and
- a follower charging circuit including:
- a follower-structured sixteenth transistor of first-type conductivity and a fourteenth switch, connected in series between said output terminal and said first power supply; and
- second bias control means for supplying a bias voltage to said sixteenth transistor based on the signal voltage of said input terminal.

11. The amplifier circuit according to claim 9, wherein in said first connection state,
said tenth, twelfth, and fourteenth switches are turned off, and said ninth, eleventh, and thirteenth switches are turned on; and wherein
in said second connection state,
said tenth, twelfth, and fourteenth switches are turned on, and said ninth, eleventh, and thirteenth switches are turned off.

12. The amplifier circuit according to claim 10, wherein in said first connection state,
said tenth, eleventh, and fourteenth switches are turned off, and said ninth, twelfth, and thirteenth switches are turned on, and said first bias control means supplies the bias voltage to said fifteenth transistor based on the signal voltage of said input terminal, and said second bias control means is turned off; and wherein in said second connection state,
said tenth, eleventh, and fourteenth switches are turned on, and said ninth, twelfth, and thirteenth switches are turned off, and said second bias control means supplies the bias voltage to said sixteenth transistor based on the signal voltage of said input terminal, and said first bias control means is turned off.

13. The amplifier circuit according to claim 10, wherein said first bias control means comprises:
- a third current source and a fifteenth switch, connected in series between said input terminal and said first power supply; and
- a series circuit including a diode-connected seventeenth transistor of second-type conductivity, a fourth current source, and a sixteenth switch, connected in series between said input terminal and said second power supply;
- a control terminal of said seventeenth transistor and a control terminal of said fifteenth transistor being commonly connected; and wherein
said second bias control means comprises:
- a fifth current source and a seventeenth switch, connected in series between said input terminal and said second power supply; and
- a series circuit including a diode-connected eighteenth transistor of first-type conductivity, a sixth current source, and an eighteenth switch, connected in series between said input terminal and said first power supply;
- a control terminal of said eighteenth transistor and a control terminal of said sixteenth transistor being commonly connected.

14. The amplifier circuit according to claim 13, wherein in said first connection state,
said seventeenth and eighteenth switches are turned off, and said fifteenth and sixteenth switches are turned on; and wherein
in said second connection state,
said seventeenth and eighteenth switches are turned on, and said fifteenth and sixteenth switches are turned off.

15. The amplifier circuit according to claim 10, wherein said first bias control means comprises:
- a diode-connected seventeenth transistor of second-type conductivity and a third current source, connected in series between said input terminal and said second power supply; and
- an eighteenth transistor connected in parallel to said seventeenth transistor, a control terminal of said eighteenth transistor receiving a first bias voltage;
- a control terminal of said seventeenth transistor and a control terminal of said fifteenth transistor being commonly connected; and wherein
said second bias control means comprises:
- a diode-connected nineteenth transistor of first-type conductivity and a fourth current source, connected in series between said input terminal and said first power supply; and
- a twentieth transistor connected in parallel to said nineteenth transistor, a control terminal of said twentieth transistor receiving a second bias voltage;
- a control terminal of said nineteenth transistor and a control terminal of said sixteenth transistor being commonly connected.

16. A display device, comprising a driver circuit for driving a data line of a display panel, said driver circuit including the amplifier circuit as defined in claim 7.

17. A driver circuit for driving each of a plurality of data lines upon receiving an output of a decoder circuit, said driver circuit comprising gray-scale generating means provided with a plurality of resistors connected in series between first and second reference voltages, for generating gray-scale voltages from respective taps, said decoder circuit receiving a digital signal and selectively outputting a voltage associated with the digital signal from output voltages of said gray-scale generating means, said driver circuit further comprising:

a plurality of amplifier circuits each comprising the amplifier circuit as defined in claim 7, associated with said plurality of data lines;

switch control means for performing switch control over each of said amplifier circuits; and bias circuits for supplying bias voltages to said current sources of said amplifier circuit.

18. A liquid crystal display device, using a dot inversion driving method, including a liquid crystal display panel and a driver circuit for driving a data line of the liquid crystal display panel, said driver circuit comprising the amplifier circuit as defined in claim 7, wherein changeover of said changeover means in said amplifier circuit is controlled, based on a polarity inversion signal, and control is performed so that for positive polarity, changeover to said first connection state is performed, and for negative polarity, changeover to said second connection state is performed.

19. A liquid crystal display device, including a liquid crystal panel and a driver circuit for driving a data line of the liquid crystal panel, said driver circuit comprising the amplifier circuit as defined in claim 7; and a comparator, receiving two data signals for signal magnitude comparison, for supplying said changeover means of said amplifier circuit with a signal indicating a result of comparison, said changeover means performing changeover, based on the result of comparison, between said first connection state and said second connection state in said amplifier circuit.

20. A display device, comprising a driver circuit for driving a data line of a display panel, said driver circuit including the amplifier circuit as defined in claim 8.

21. A driver circuit for driving each of a plurality of data lines upon receiving an output of a decoder circuit, said driver circuit comprising gray-scale generating means provided with a plurality of resistors connected in series between first and second reference voltages, for generating gray-scale voltages from respective taps, said decoder circuit receiving a digital signal and selectively outputting a voltage associated with the digital signal from output voltages of said gray-scale generating means, said driver circuit further comprising:

a plurality of amplifier circuits each comprising the amplifier circuit as defined in claim 8, associated with said plurality of data lines;

switch control means for performing switch control over each of said amplifier circuits; and bias circuits for supplying bias voltages to said current sources of said amplifier circuit.

22. A liquid crystal display device, using a dot inversion driving method, including a liquid crystal display panel and a driver circuit for driving a data line of the liquid crystal display panel, said driver circuit comprising the amplifier circuit as defined in claim 8, wherein changeover of said changeover means in said amplifier circuit is controlled, based on a polarity inversion signal, and control is performed so that for positive polarity, changeover to said first connection state is performed, and for negative polarity, changeover to said second connection state is performed.

23. A liquid crystal display device, including a liquid crystal panel and a driver circuit for driving a data line of the liquid crystal panel, said driver circuit comprising the amplifier circuit as defined in claim 8; and a comparator, receiving two data signals for signal magnitude comparison, for supplying said changeover means of said amplifier circuit with a signal indicating a result of comparison, said changeover means performing changeover, based on the result of comparison, between said first connection state and said second connection state in said amplifier circuit.

* * * * *